US009619177B2

(12) United States Patent
Okita et al.

(10) Patent No.: US 9,619,177 B2
(45) Date of Patent: Apr. 11, 2017

(54) MEMORY SYSTEM INCLUDING NON-VOLATILE MEMORY, BUFFER MEMORY, AND CONTROLLER CONTROLLING READING DATA FROM NON-VOLATILE MEMORY

(71) Applicant: KABUSHIKI KAISHA TOSHIBA, Minato-ku (JP)

(72) Inventors: Kazuhito Okita, Tokyo (JP); Kiyotaka Matsuo, Kanagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/238,426

(22) Filed: Aug. 16, 2016

(65) Prior Publication Data

US 2016/0357483 A1    Dec. 8, 2016

Related U.S. Application Data

(63) Continuation-in-part of application No. 14/471,070, filed on Aug. 28, 2014, now Pat. No. 9,442,657.

(60) Provisional application No. 62/008,264, filed on Jun. 5, 2014.

(51) Int. Cl.
*G06F 12/00* (2006.01)
*G06F 3/06* (2006.01)
*G11C 16/26* (2006.01)

(52) U.S. Cl.
CPC .......... *G06F 3/0659* (2013.01); *G06F 3/0604* (2013.01); *G06F 3/0679* (2013.01); *G11C 16/26* (2013.01)

(58) Field of Classification Search
CPC .... G06F 3/0659; G06F 3/0604; G06F 3/0679; G06F 3/0611; G11C 16/26
USPC .................. 711/103, 154, 167; 710/316, 317
See application file for complete search history.

(56) References Cited

U.S. PATENT DOCUMENTS

| 6,925,641 | B1 | 8/2005 | Elabd |
| 8,402,205 | B2 | 3/2013 | Goss |
| 9,442,657 | B2 * | 9/2016 | Okita ..................... G06F 3/0604 |
| 2001/0056579 | A1 | 12/2001 | Kogane |

(Continued)

FOREIGN PATENT DOCUMENTS

| JP | 2012-027649 | 2/2012 |
| JP | 2012-68936 | 4/2012 |

(Continued)

*Primary Examiner* — Hong Kim
(74) *Attorney, Agent, or Firm* — Oblon, McClelland, Maier & Neustadt, L.L.P.

(57) ABSTRACT

According to one embodiment, a system includes first to third managers and a storage unit. The first manager generates read requests corresponding to read-unit data items read by a read command received from an device, and manages first information indicating the state of transmission of the read-unit data items to the device. The storage unit temporarily stores the read-unit data items read from nonvolatile memories in a random order, based on the read requests. The second manager manages second information indicating whether each read-unit data item has been read from the nonvolatile memories. The third manager transmits, based on the first and second information, the read-unit data items to the device in an order designated by the read command, the read-unit data items being stored in the storage unit in a random order.

7 Claims, 20 Drawing Sheets

(56) References Cited

U.S. PATENT DOCUMENTS

| | | |
|---|---|---|
| 2002/0087823 A1 | 7/2002 | Chow |
| 2005/0129014 A1 | 6/2005 | Lee |
| 2009/0307408 A1 | 12/2009 | Naylor |
| 2012/0079172 A1 | 3/2012 | Yoshida |
| 2012/0151101 A1 | 6/2012 | Matsuo et al. |
| 2013/0067144 A1 | 3/2013 | Namba et al. |
| 2013/0067147 A1 | 3/2013 | Okita |
| 2014/0173192 A1 | 6/2014 | Omtzigt |
| 2014/0215129 A1* | 7/2014 | Kuzmin .............. G06F 12/0246 711/103 |

FOREIGN PATENT DOCUMENTS

| | | |
|---|---|---|
| JP | 2012-128560 | 7/2012 |
| JP | 2013-61795 | 4/2013 |
| JP | 2013-77283 | 4/2013 |

\* cited by examiner

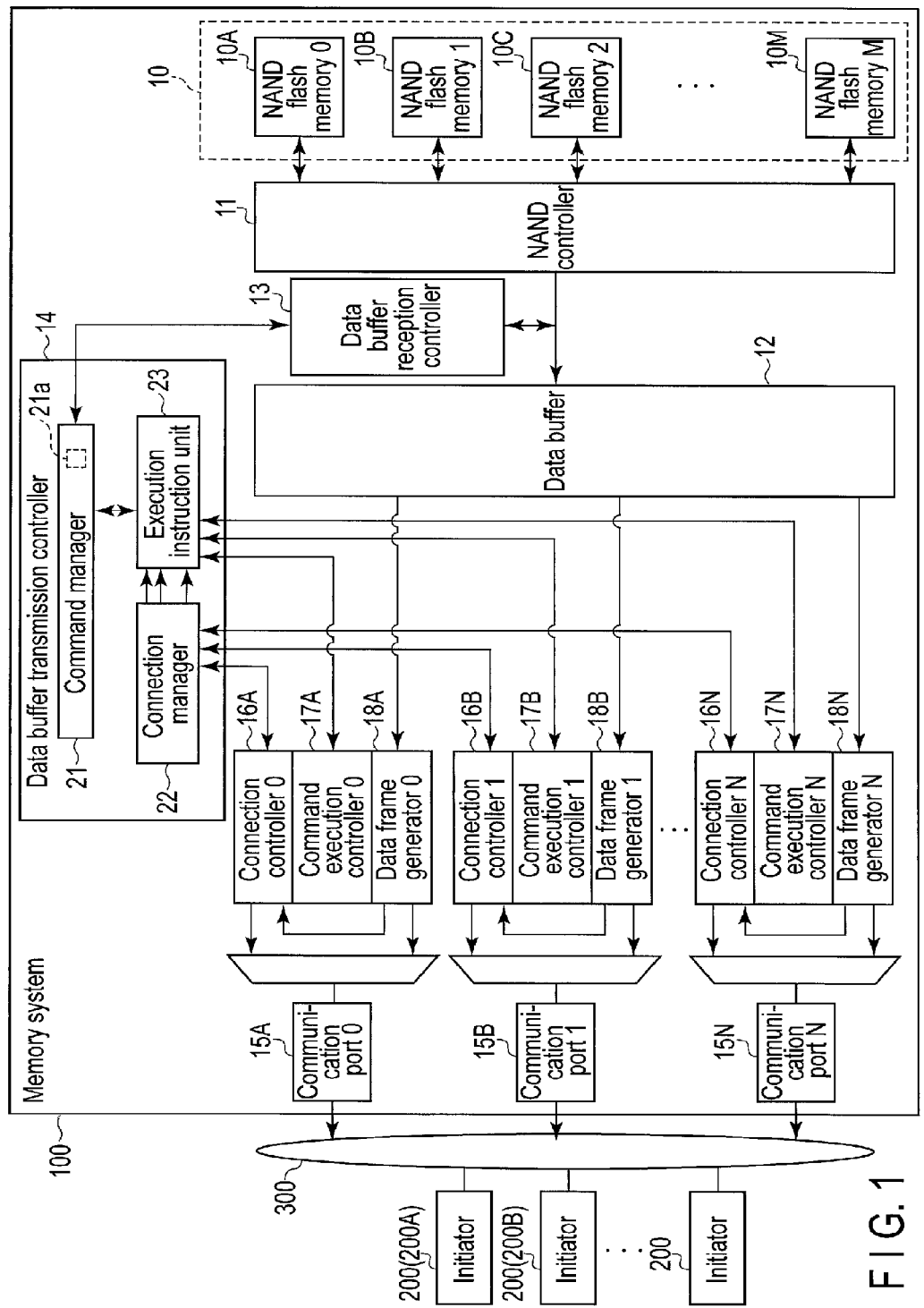
F I G. 1

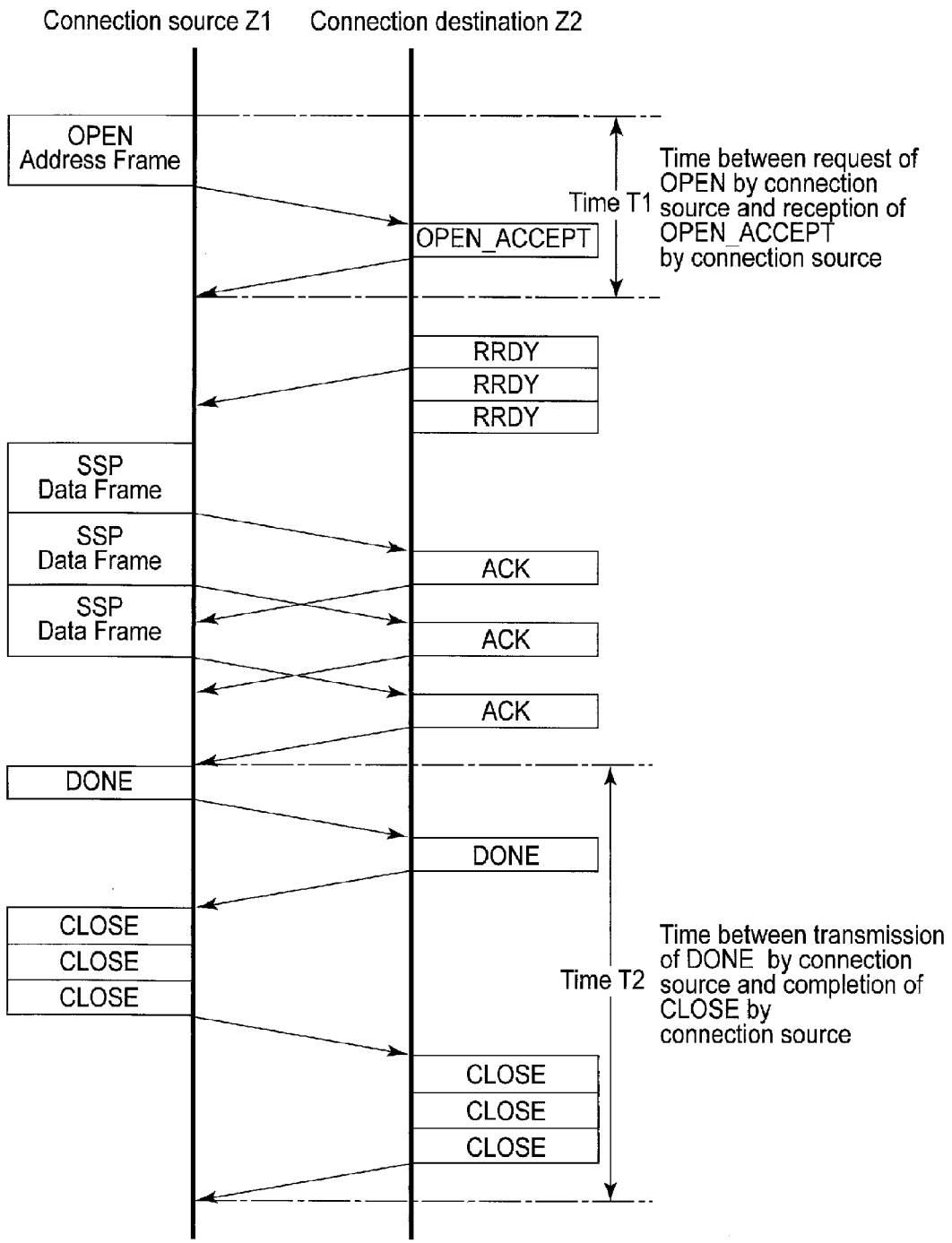
F I G. 2

| | Command information | | | | Storage information | | | |
|---|---|---|---|---|---|---|---|---|
| TAG type | Communication port type | Initiator type | Command elapsed time information | Other information | Transferable sector number information | HAP information | MAP information | Reception data management information |
| TAG0 | Port | Initiator | Command elapsed time | ... | Number of transferable sectors | HAP | MAP | Reception data management information |
| TAG1 | Port | Initiator | Command elapsed time | ... | Number of transferable sectors | HAP | MAP | Reception data management information |
| TAG2 | Port | Initiator | Command elapsed time | ... | Number of transferable sectors | HAP | MAP | Reception data management information |
| ... | ... | ... | ... | ... | ... | ... | ... | ... |
| TAGN | Port | Initiator | Command elapsed time | ... | Number of transferable sectors | HAP | MAP | Reception data management information |

F I G. 3

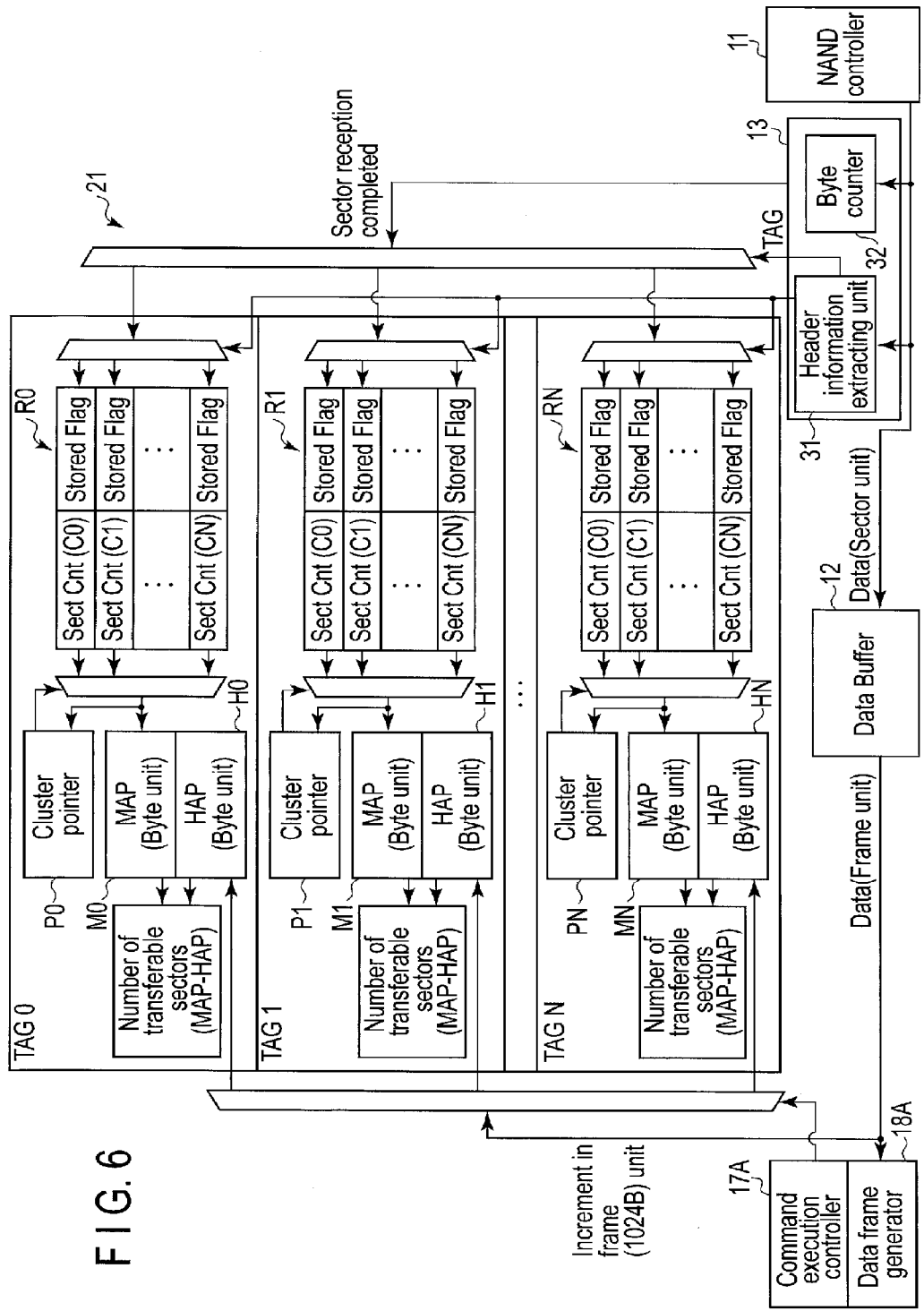
F I G. 6

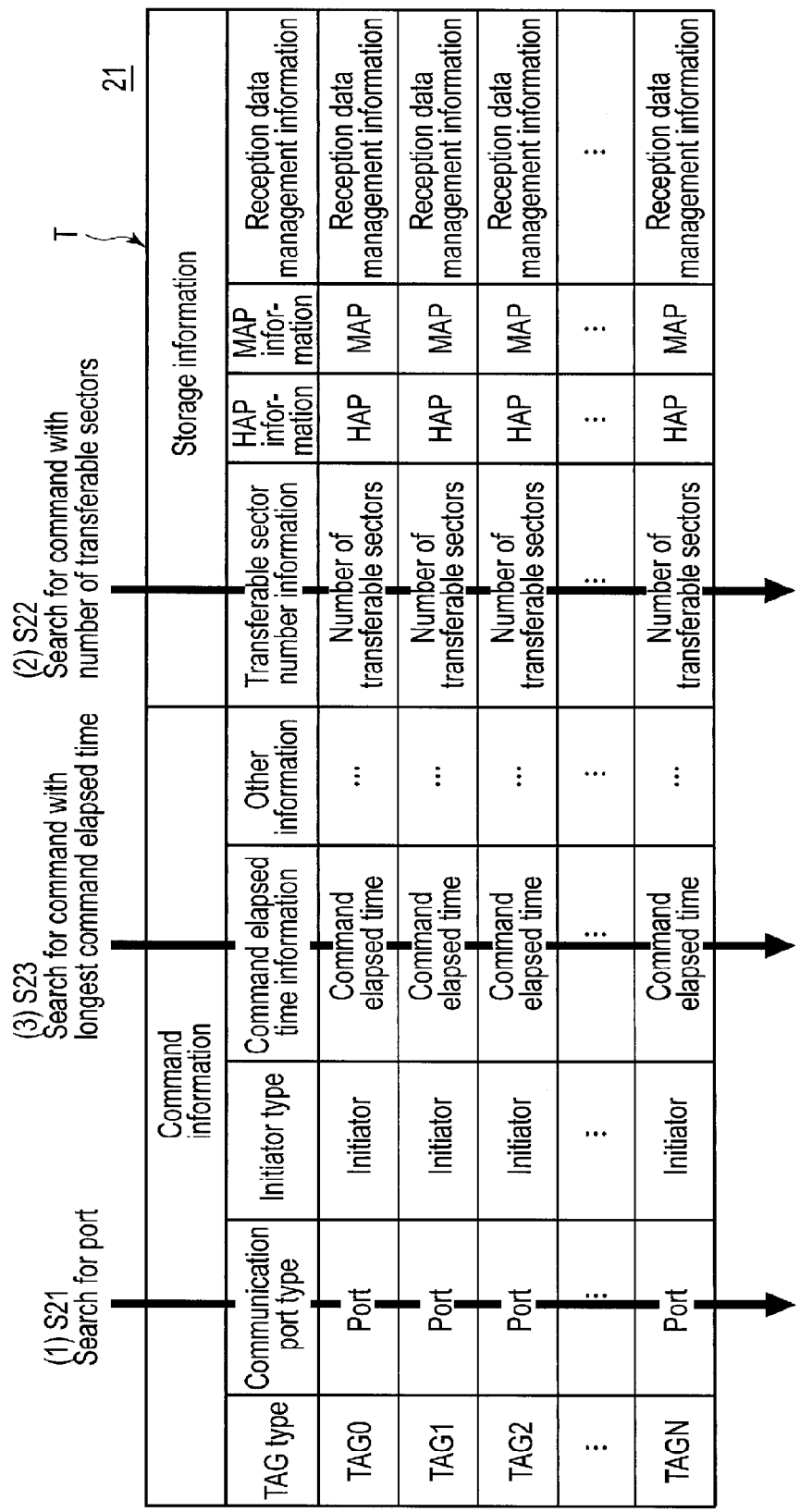
F I G. 9

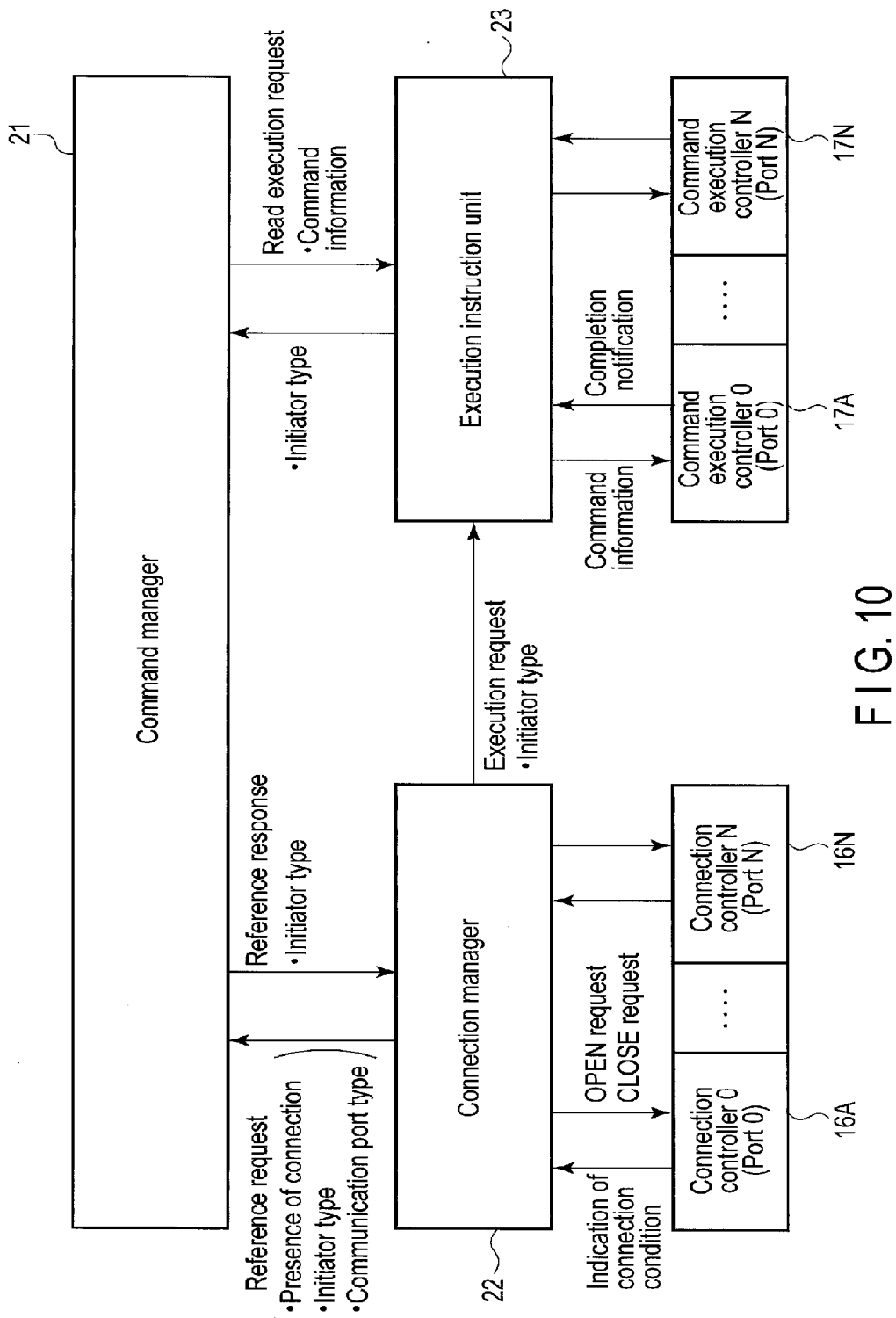
F I G. 10

| TAG type | Command information ||||| Storage information ||| |
| --- | --- | --- | --- | --- | --- | --- | --- | --- |
| | Communication port type | Initiator type | Command elapsed time information | Other information | Transferable sector number information | HAP information | MAP information | Reception data management information |
| TAG0 | Port | Initiator | Command elapsed time | ... | Number of transferable sectors | HAP | MAP | Reception data management information |
| TAG1 | Port | Initiator | Command elapsed time | ... | Number of transferable sectors | HAP | MAP | Reception data management information |
| TAG2 | Port | Initiator | Command elapsed time | ... | Number of transferable sectors | HAP | MAP | Reception data management information |
| ... | ... | ... | ... | ... | ... | ... | ... | ... |
| TAGN | Port | Initiator | Command elapsed time | ... | Number of transferable sectors | HAP | MAP | Reception data management information |

(1) S31 Search for port (2) S32 Search for number of transferable sectors

T, 21

F I G. 12

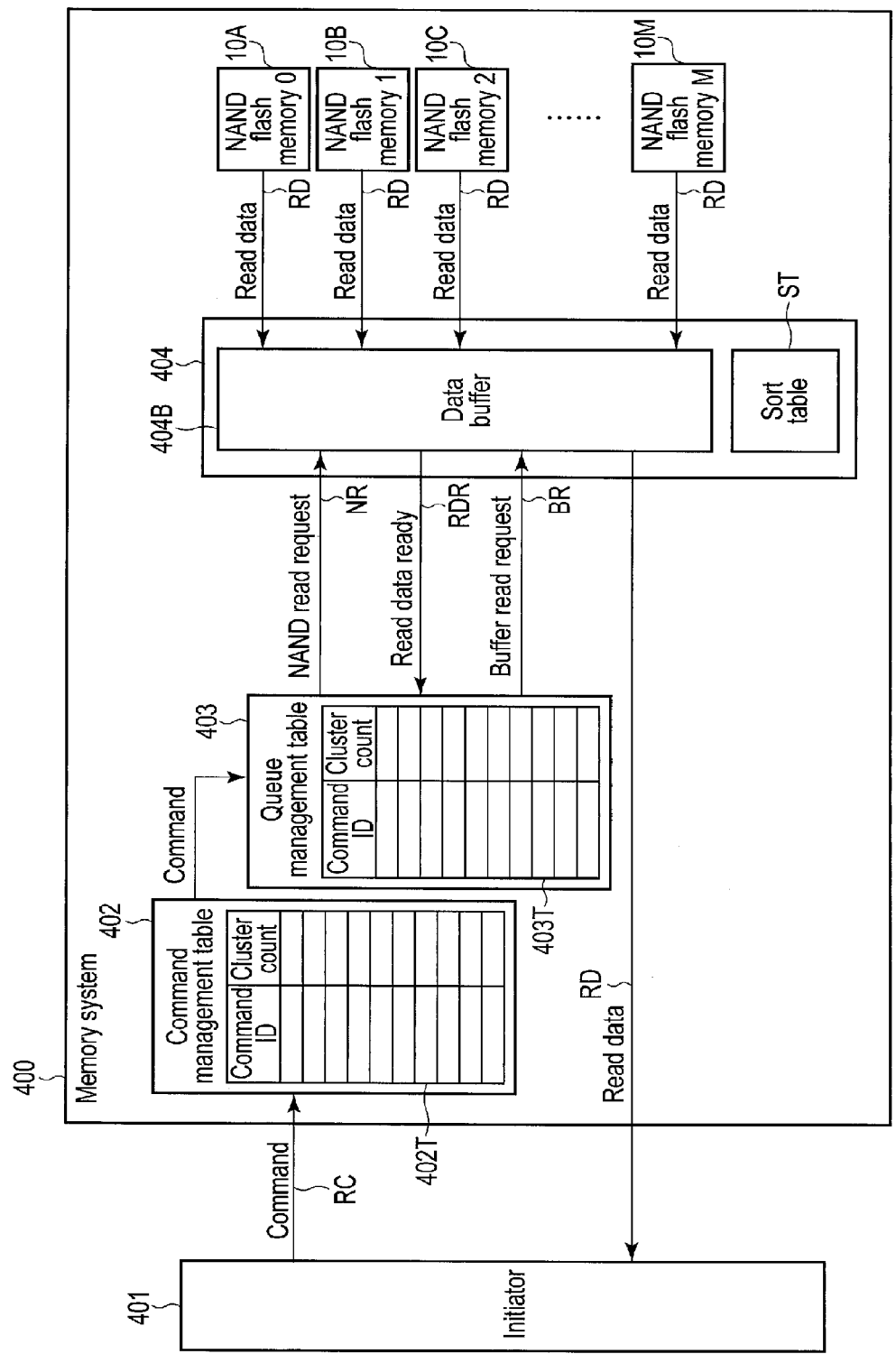
F I G. 13

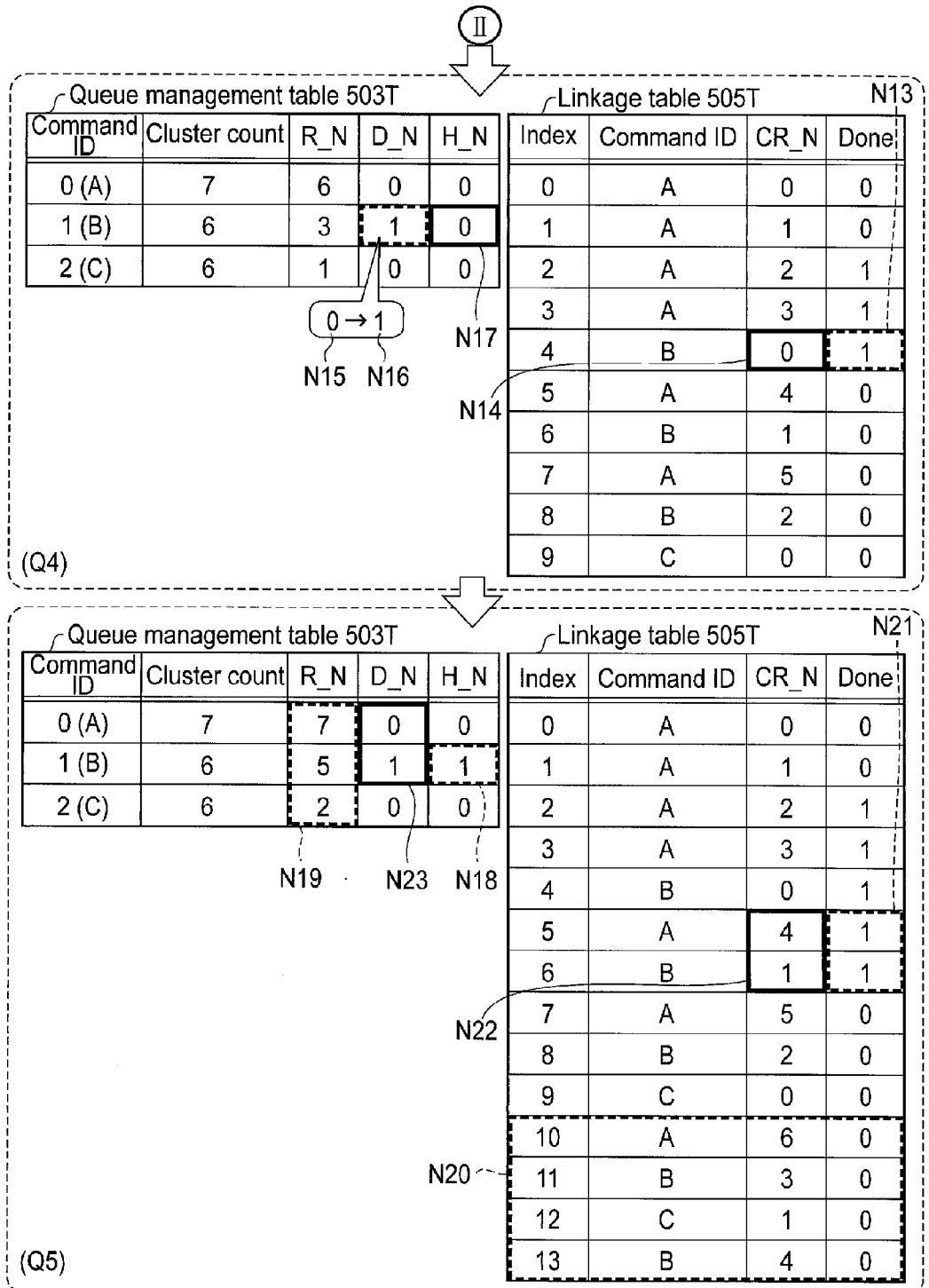
F I G. 20

MEMORY SYSTEM INCLUDING NON-VOLATILE MEMORY, BUFFER MEMORY, AND CONTROLLER CONTROLLING READING DATA FROM NON-VOLATILE MEMORY

CROSS REFERENCE TO RELATED APPLICATIONS

This application is a Continuation-in-Part application of U.S. patent application Ser. No. 14/471,070, filed Aug. 28, 2014 and claiming the benefit of U.S. Provisional Application No. 62/008,264, filed Jun. 5, 2014, the entire contents of which are incorporated herein by reference.

FIELD

Embodiments described herein relate generally to a memory system.

BACKGROUND

Memory systems with a controller for controlling reading and writing of data from and into a flash memory are provided.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a block diagram showing a configuration example of a memory system according to a first embodiment.

FIG. 2 is a timing chart showing an example of a connection operation according to the first embodiment.

FIG. 3 shows an example of a command management table according to the first embodiment.

FIG. 6 shows an example of a structure for obtaining a data reception state and the number of consecutive sectors according to the first embodiment.

FIG. 9 schematically shows an example of a process in which an initiator is selected by the command manager when notification indicating no connection is received, according to the first embodiment.

FIG. 10 shows an example of transfer of control signals according to the first embodiment.

FIG. 12 schematically shows an example of a process in which a command manager according to a second embodiment selects an optimal command.

FIG. 13 is a block diagram showing a memory system example for rearranging read data according to a third embodiment.

FIG. 20 shows a second example of states of a queue management table and a linkage table according to the third embodiment.

DETAILED DESCRIPTION

Figure 4:
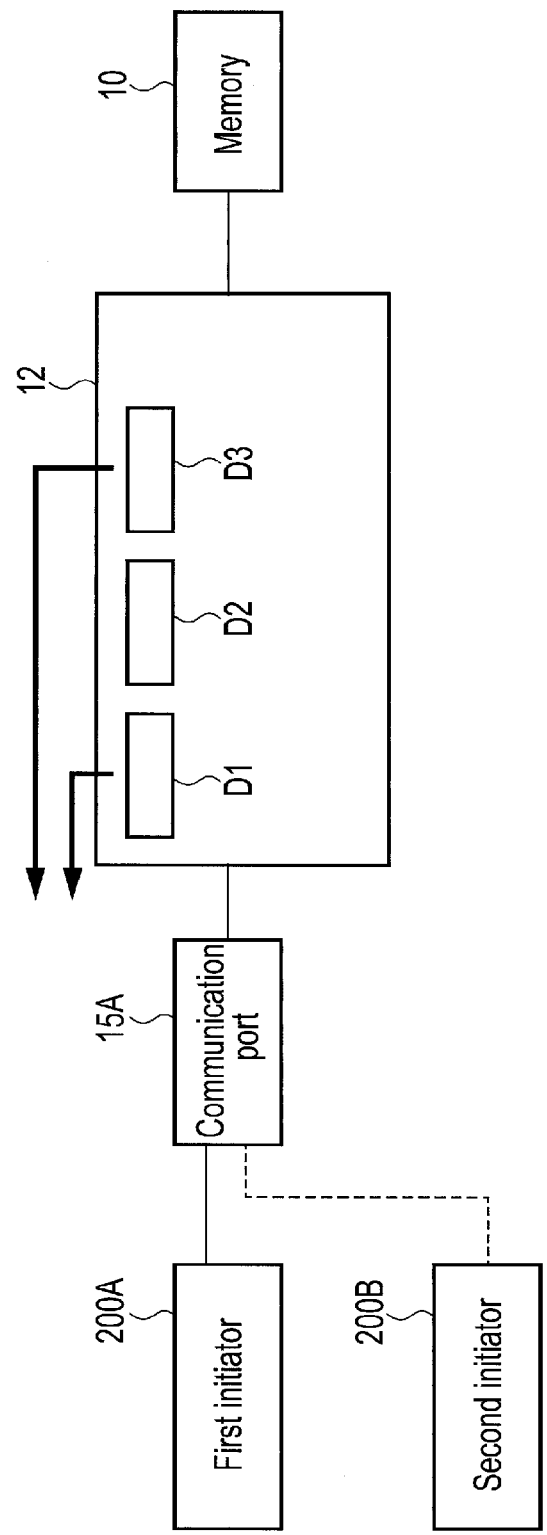
FIG. 4 schematically shows an example of a data transmission operation according to the first embodiment.

Various embodiments will be described hereinafter with reference to the accompanying drawings.

In general, according to one embodiment, a memory system includes: nonvolatile memories; first to third managers and a storage unit. The first manager generates read requests corresponding to read-unit data items read by a read command received from an external device, and manages first information indicating the state of transmission of the read-unit data items to the external device. The storage unit temporarily stores the read-unit data items read from the nonvolatile memories in a random order, based on the read requests. The second manager manages second information indicating whether each read-unit data item has been read from the nonvolatile memories. The third manager transmits, based on the first and second information, the read-unit data items to the external device in an order designated by the read command, the read-unit data items being stored in the storage unit in a random order.

In this specification, some components are expressed by two or more terms. These terms are merely examples. The components may be further expressed by another or other terms. The other components which are not expressed by two or more terms may be expressed by another or other terms.

First Embodiment

FIG. 1 shows an example of a memory system 100 according to a first embodiment. The memory system 100 is an example of each of a semiconductor system and a semiconductor device, and is, for example, a solid-state drive (SSD). It should be noted that the memory system 100 is not limited to this. The memory system 100 is an example of a target.

The memory system 100 is connected to a plurality of initiators 200 through an interface. Each of the initiators 200 is an example of each of an external device, an information-processing device and an information-processing module. Although the interface is, for example, a Serial Attached SCSI (SAS) interface, it is not limited to this. The memory system 100 can perform two-way simultaneous communications with the initiators 200 through the interface.

When data is transmitted and received between the memory system 100 and each initiator 200, a connection operation based on a predetermined protocol is performed between a connection destination and a connection source.

FIG. 2 shows an example of a connection operation between the memory system 100 and each initiator 200. It should be noted that in the following description, the side of requesting the connection operation will be called a connection source, and that of receiving the request of the connection operation will be called a connection destination. Here, each of the memory system 100 and the initiator 200 can be both the connection source and the connection destination. That is, the memory system 100 may be the connection source and the initiator 200 may be the connection destination. Alternatively, the initiator 200 may be the connection source, and the memory system 100 may be the connection destination.

As shown in FIG. 2, if a connection source Z1 transmits a data frame, the connection source Z1 issues a connection request by transmitting an OPEN address frame to the side to which a connection is requested (hereinafter referred to as connection destination) Z2. When the connection destination Z2 receives the OPEN address frame from the connection source Z1, contents of the received OPEN address frame are confirmed.

If the connection destination Z2 determines that it can be connected to the connection source Z1, the connection destination Z2 transmits an OPEN_ACCEPT primitive to the connection source Z1. When the connection source Z1 receives the OPEN_ACCEPT primitive from the connection destination Z2, connection processing for transmitting and receiving data between the connection source Z1 and the connection destination Z2 is completed.

After determining an empty state of a data buffer, the connection destination Z2 transmits RRDY primitives for receivable frames to the connection source Z1. The connection source Z1 can transmit data frames equivalent to the RRDY primitives received from the connection destination Z2 to the connection destination Z2. In FIG. 2, for example, three SSP data frames are transmitted from the connection source Z1 to the connection destination Z2. The connection destination Z2 transmits ACKs for the received SSP data frames to the connection source Z1. Transmission control of the data frames is performed in this manner.

It should be noted that the connection source Z1 can also transmit the RRDY primitives for receivable frames to the connection destination Z2 in the same manner after determining an empty state of a data buffer. Then, the connection destination Z2 can transmit data frames (SSP data frames) equivalent to the RRDY primitives received from the connection source Z1 to the connection source Z1.

This protocol allows data to be transmitted and received between the connection source Z1 and the connection destination Z2 using an SAS interface. Even if both the connection source Z1 and the connection destination Z2 get in a connection state in response to transmission of the Open address frame (connection request) from either of them, it is allowed also in the protocol of the SAS interface that data can be transmitted if credit of the RRDY primitive is present. That is, even if both of them get in the connection state in response to the connection request from the connection source Z1, data can be transmitted from the connection destination Z2 to the connection source Z1.

If data to be transmitted is not present in the connection source Z1 or the connection destination Z2, the connection source Z1 transmits a DONE primitive to the connection destination Z2. Then, a connection is closed by transmitting CLOSE primitives between the connection source Z1 and the connection destination Z2.

For example, in the communication method using an SAS interface as described above, a connection operation for determining the connection source Z1 and the connection destination Z2 is needed. A handshake is performed in accordance with a condition (for example, a communication condition) of both the connection source Z1 and the connection destination Z2. Thus, the time of the connection operation is associated with transfer efficiency of data. For example, the time required for the connection operation in FIG. 2 is a period of time obtained by adding time T1 between transmission of the OPEN address frame by the connection source Z1 and reception of OPEN_ACCEPT by the connection source Z1 to time T2 between transmission of DONE by the connection source Z1 and reception of CLOSE by the connection source Z1.

Thus, the memory system 100 can reduce the number of connection operations (total time of connection operations) by transmitting data as much as possible in one connection, and the transfer efficiency of data can be improved. Hereinafter, an example of the memory system 100, in which the transfer efficiency of data can be improved from the above viewpoint, will be described.

(Structure of Memory System 100)

As shown in FIG. 1, the memory system 100 can be connected to the plurality of initiators 200 through an expander 300. The memory system 100 receives commands (for example, read commands) from each of the plurality of initiators 200, and transmits data corresponding to the commands to the initiator 200 which issued the commands.

Specifically, the memory system 100 comprises a memory 10, a NAND controller 11, a data buffer 12, a data buffer reception controller 13, a data buffer transmission controller 14, communication ports 15A-15N, connection controllers 16A-16N, command execution controllers 17A-17N and data frame generators 18A-18N.

The memory 10 is an example of a non-volatile memory, and stores data. The memory 10 comprises, for example, a plurality of NAND flash memories 10A-10M. Each of the NAND flash memories 10A-10M is each of an example of a memory, a semiconductor memory and a non-volatile memory. It should be noted that the memory 10 may be constituted of a NAND flash memory. Also, the memory is not limited to the NAND flash memory.

The NAND controller 11 is an example of each of a memory controller, and a first controller. The NAND controller 11 reads data from the memory 10 in, for example, a cluster unit. It should be noted that a cluster includes, for example, eight sectors.

The NAND controller 11 reads a plurality of data items corresponding to the plurality of commands in parallel from the memory 10 (for example, plurality of NAND flash memories 10A-10M) in response to a plurality of read commands from the plurality of initiators 200. Also, the NAND controller 11 may read in parallel, from the memory 10, a plurality of data items corresponding to a plurality of read commands issued from, for example, one initiator 200. The NAND controller 11 temporarily stores the plurality of read data items for each predetermined unit (for example, for each sector unit) in the data buffer 12.

The data buffer 12 is an example of each of a storage, a data transfer unit, a memory and a volatile memory. The data buffer 12 is, for example, a so-called read buffer. Although the data buffer 12 is, for example, a static random access memory (SRAM), it may be a dynamic random access memory (DRAM). Also, the data buffer 12 may be other types of memories, and is not especially limited.

The data buffer 12 stores data read from the memory 10 by the NAND controller 11 for each predetermined unit (for example, for each sector unit). A plurality of data items read in parallel from the memory 10 in response to the read commands from the plurality of initiators 200 are stored in the data buffer 12, for example, for each predetermined unit in the reading order.

The data buffer reception controller 13 extracts predetermined information from data when the data is stored from the NAND controller 11 to the data buffer 12. Specifically, the data buffer reception controller 13 extracts header information H (see FIG. 5) included in data to be transmitted from the NAND controller 11 to the data buffer 12, and information concerning the length of the data (for example, the number of sectors), etc.

The data buffer transmission controller 14 is an example of a second controller. It manages connection conditions between communication ports 15A-15N and the plurality of initiators 200, and transmits (transfers) data stored in the data buffer 12 to the initiators 200. The data buffer transmission controller 14 according to this embodiment comprises a command manager 21, a connection manager 22 and an execution instruction unit 23.

The command manager 21 manages the progress situation of the commands received from each of the plurality of initiators 200. Specifically, the command manager 21 comprises, for example, a command management table T (see FIG. 3), and manages command information of a plurality of commands received from the plurality of initiators 200 and storage information of data read from the memory 10 in response to the commands in association with each other.

The connection manager 22 manages connection conditions between communication ports 15A-15N and the plurality of initiators 200. That is, the connection manager 22 refers to the connection conditions of communication ports 15A-15N, and detects the initiator 200 connected to communication ports 15A-15N.

The execution instruction unit 23 is an example of a controller, and transmits data stored in the data buffer 12 to the initiator 200 corresponding to the data based on an output from the command manager 21 and the connection manager 22. It should be noted that in another viewpoint, the command manager 21 and the execution instruction unit 23 may be collectively called a controller. Also, in another viewpoint, the command manager 21, the execution instruction unit 23, the connection controllers 16A-16N, the command execution controllers 17A-17N and the data frame generators 18A-18N may be collectively called a controller. Also, a controller is not limited to the above controllers, and a controller comprising the connection manager 22 may be called a controller. It should be noted that functions and operations of the command manager 21, the connection manager 22 and the execution instruction unit 23 will be described in detail.

Each of the plurality of communication ports 15A-15N is an example of an interface. Each of communication ports 15A-15N can be connected to the plurality of initiators 200 through the expander 300, and can perform two-way communications with the initiators 200 being connected. For example, the SAS interface is used for each of communication ports 15A-15N. It should be noted that an interface may be constituted of, for example, a communication port.

Each of the connection controllers 16A-16N obtains connection information concerning a connection between the corresponding communication ports 15A-15N and the initiators 200, and indicates the connection information to the connection manager 22. It should be noted that the connection information includes information concerning the presence of connection between the communication port (any of communication ports 15A-15N) and the initiator 200, and information as to which initiator 200 the communication port is connected to if it is connected to the initiator 200.

Instructions concerning data transfer are indicated from the execution instruction unit 23 to each of the command execution controllers 17A-17N. Each of the data frame generators 18A-18N generates a data frame from data of a frame unit received from the data buffer 12. Each of the data frame generators 18A-18N transmits the generated data frame to the initiator 200 through the corresponding communication port (any of communication ports 15A-15N).

It should be noted that as shown in FIG. 1, a set of the connection controller 16A, the command execution controller 17A and the data frame generator 18A are configured to perform data transmission in response to communication port 15A. Also, the other communication ports 15B-15N have similar structures.

Next, the data buffer transmission controller 14 will be described in more detail.

As described above, the data buffer transmission controller 14 comprises the command manager 21, the connection manager 22, and the execution instruction unit 23.

FIG. 3 shows an example of the command management table T managed by the command manager 21. On the command management table T, command information concerning a plurality of commands from the plurality of initiators 200 and storage information concerning data read from the memory 10 in response to the commands are managed in association with each other.

The command information includes, for example, TAG type, port type, initiator type, command elapsed time information and other information. The TAG is an identification code assigned to each command to identify each command. That is, the TAG type may be called a command type. Information concerning the TAG assigned to each command is stored in the TAG type. The data buffer transmission controller 14 identifies to which command each information corresponds by referring to the TAG type.

The port type is information for identifying to which of communication ports 15A-15N the communication port which received each command (communication port connected to the initiator 200 which issued each command) corresponds. For example, an identification number of each of communication ports 15A-15N is stored in the port type. The initiator type is information for identifying to which of the plurality of initiators 200 the initiator 200 which issued each command corresponds. For example, an identification number of each of the initiators 200 is stored in the initiator type. The command elapsed time information is information indicating an elapsed time from reception of a command. The command information is registered by the connection manager 22.

On the other hand, the storage information includes, for example, transferable sector number information, host access pointer (HAP) information, media access pointer (MAP) information and other reception data management information. The transferable sector number information is information concerning the amount of data (for example, the number of sectors) which is read into the data buffer 12 in response to each command and can be transmitted (transferred) from the data buffer 12 to the initiator 200. The transferable sector number information is an example of transferable amount information.

The HAP refers to the amount of data (for example, the number of sectors) already transmitted (transferred) from the data buffer 12 to the initiators 200 in response to each command. That is, the HAP information includes information indicating the amount of data (for example, the number of sectors) which has been transmitted from the data buffer 12 to the initiators 200 in response to each command.

On the other hand, the MAP refers to the amount of data (for example, the number of sectors) read from the memory 10 to the data buffer 12. That is, the MAP information includes information indicating the amount of data (the number of sectors) read from the memory 10 to the data buffer 12. Thus, the difference between the MAP and the HAP corresponds to the amount of data which is left in the data buffer 12 at that moment, and can be transmitted from the data buffer 12 to the initiators 200.

As shown in FIG. 1, the connection manager 22 manages (monitors) connection conditions between communication ports 15A-15N and the initiators 200 based on an output from the connection controllers 16A-16N. That is, the connection manager 22 detects the initiator 200 being connected (initiator 200 in a connection state) from a plurality of initiators 200. The connection manager 22 transmits information concerning the detected initiator 200 being connected (for example, identification number of the initiator 200) to the execution instruction unit 23.

The execution instruction unit 23 can continuously transmit a plurality of data items to be transmitted to the initiator 200 being connected from the data buffer 12 based on an output from the connection manager 22, regardless of a storing order from the memory 10 in the data buffer 12. In this embodiment, the execution instruction unit 23 continuously transmits the plurality of data items of the predetermined unit (for example, sector unit) to be transmitted to the initiator 200 being connected from the data buffer 12 based on the output from the connection manager 22, regardless of the storing order in the data buffer 12.

FIG. 4 schematically shows an example of data transmission operation according to this embodiment. It should be noted that of the plurality of communication ports 15A-15N, an operation of communication port 15A will be described as a representative in the following description. Operations of the other communication ports 15B-15N are similar to that of communication port 15A.

As shown in FIG. 4, the plurality of initiators 200 comprises a first initiator 200A and a second initiator 200B. For example, first data D1 to be transmitted to the first initiator 200A, second data D2 to be transmitted to the second initiator 200B and third data D3 to be transmitted to the first initiator 200A are read from the memory 10 and stored in the data buffer 12 in this order. In this embodiment, when the connection manager 22 detects that the first initiator 200A is connected, the execution instruction unit 23 continuously transmits the first data D1 and the third data D3 to the first initiator 200A.

Also, in another operation example, when communication port 15A and the first initiator 200A are connected in response to the request from the first initiator 200A, the execution instruction unit 23 detects the presence of data to be transmitted to the first initiator 200A in the data buffer 12, and if the data to be transmitted to the first initiator 200A is present, the execution instruction unit 23 transmits the data to the first initiator 200A.

A specific example of the transmission operation will be hereinafter described.

When the NAND controller 11 reads data from the plurality of NAND flash memories 10A-10M, the memory system 100 parallelizes and processes a plurality of read commands to make a reading latency apparently absent. Thus, data is not stored in the data buffer 12 from head data for each sector, for each read command.

Then, the command manager 21 manages, for each read command, the progress of data reception to the data buffer 12, and the amount of data which can be transferred to the initiators 200.

Also, the data buffer 12 can preset the storage position of data (what area the data is written in) for each read command. This allows the continuity of data to be transmitted to the initiator 200 to be secured, even if storage from the NAND flash memories 10A-10M to the data buffer 12 is not performed for each command from the head data.

Figure 5:
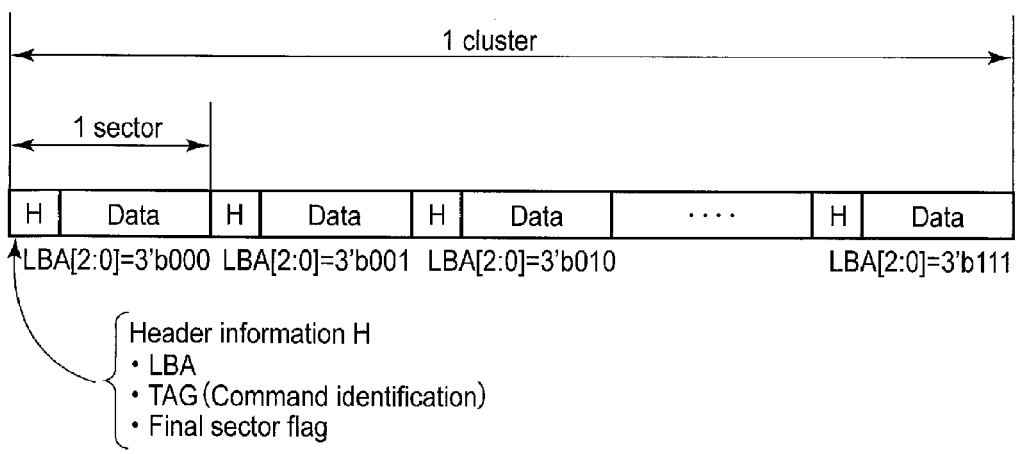
FIG. 5 shows an example of a structure of data received from a NAND controller by a data buffer reception controller according to the first embodiment.

FIG. 5 shows an example of a structure of data received from the NAND controller 11 by the data buffer reception controller 13. The unit of data received from the NAND controller 11 by the data buffer reception controller 13 is, for example, one cluster. One cluster includes, for example, eight sectors of logical block address (LBA) [2:0]-3'b000 to LAB[2:0]=3'b111. Also, each sector includes a data portion and the header information H to be added to the head of the data portion. The header information H includes the LBA, TAG for identifying a read command and a final sector flag.

FIG. 6 shows an example of a structure for managing a data reception state of the data buffer 12, and the number of sectors which can be transferred to the initiator 200 (for example, the number of consecutive sectors which can be transferred). The data buffer reception controller 13 comprises a header information extracting unit 31 and a byte counter 32. When receiving data of a format shown in FIG. 5 from the NAND controller 11, the data buffer reception controller 13 detects the TAG from the header information H, and updates a reception state of data corresponding to the detected TAG (storage information of the command management table T).

When the update of the command management table T ends, the header information H is removed, and only a data portion is stored in the data buffer 12. It should be noted that data smaller than a cluster is not present except for a head cluster and a final cluster for the read command.

The command manager 21 comprises, for each of TAG0-TAGN, an area (sector counter) R0-RN in which a sector count value of each cluster can be stored. When storage in the data buffer 12 for each data item of a received sector unit is completed, the data buffer reception controller 13 outputs sector reception completion notification from the byte counter 32. The sector counter of a cluster for each TAG is incremented based on the sector reception completion notification. Which cluster contains the sector counter to be incremented is determined based on upper bits other than low three bits of the LBA added to the header information H (portion corresponding to identification of clusters).

When sector counters R0-RN of each cluster receives a sector including LBA[2:0]=3'b111 in the header information H, or when it receives data including the final sector flag in the header information H, the storage of data in the data buffer 12 is considered to be completed.

Each of cluster pointers P0-PN refers to sectors sequentially from the head sector in which the stored flag indicating the completion of data storage is asserted, and increments a cluster pointer after the number of sector counts indicated by the cluster pointer is reflected in a corresponding MAP (any of MAP0-MAPN). Each of MAP0-MAPN indicates the number of consecutive sectors for the sectors stored in the data buffer 12 with respect to each read command.

On the other hand, if the storage of the number of sector counts displayed in cluster pointers P0-PN has not been completed (if the stored flag has not been asserted), cluster pointers P0-PN keep displaying the values, which are held until the reception of the data of the cluster ends.

Such a structure allows the number of sectors stored from the head sector to be reflected in MAP0-MAPN. Accordingly, the command manager 21 can manage the number of transferable sectors which can be continuously output to each of the initiators 200.

When transfer start of data is instructed by the execution instruction unit 23, the command execution controller 17A indicates the transfer start to the data frame generator 18A. The data frame generator 18A transmits a data frame to the initiator 200 through communication port 15A (data transfer).

When the transmission of the data frame to the initiator 200 ends, the corresponding HAP is incremented in a transfer byte unit (frame unit). Thus, the difference between the MAP and HAP corresponds to the number of transferable sectors. The number of transferable sectors is managed (registered and updated) in the command manager 21 (command management table T) along with the MAP and HAP.

Such a structure allows the command manager 21 to manage, for each read command, the progress of data reception to the data buffer 12, and the amount of data which can be transferred to the initiator 200. Thus, the command manager 21 can manage a plurality of data items (for example, plurality of data items of the predetermined unit) to be continuously transmitted in the data buffer 12 in response to each command.

When transmitting a data item of a predetermined unit (for example, sector unit) corresponding to a command to the initiator 200 being connected, the data buffer transmission controller 14 continuously transmits another data item of the predetermined unit corresponding to the same command to the initiator 200 being connected based on the output from the command manager 21. That is, if the plurality of data items of the predetermined unit are stored in response to a command, the data buffer transmission controller 14 continuously transmits the plurality of data items of the predetermined unit to the initiator 200 being connected.

Also, the data buffer transmission controller 14 may continuously transmit, from the data buffer 12, a plurality of data items corresponding to a plurality of commands and to be transmitted to the initiator 200 being connected based on the output of the connection manager 22. That is, if a plurality of data items corresponding to a plurality of commands are to be transmitted to the same initiator 200 on the command management table T of the command manager 21, the plurality of data items may be continuously transmitted in one connection.

Also, the data buffer transmission controller 14 according to this embodiment selects a command optimal for data transfer (command to be processed earliest, hereinafter referred to as optimal command) based on a connection condition of communication port 15A managed by the connection manager 22, and the command information and storage information managed by the command manager 21, and transmits the data stored in the data buffer 12 to the initiator 200 being connected in response to the selected command. The selection of the optimal command will be described in detail.

Figure 7:
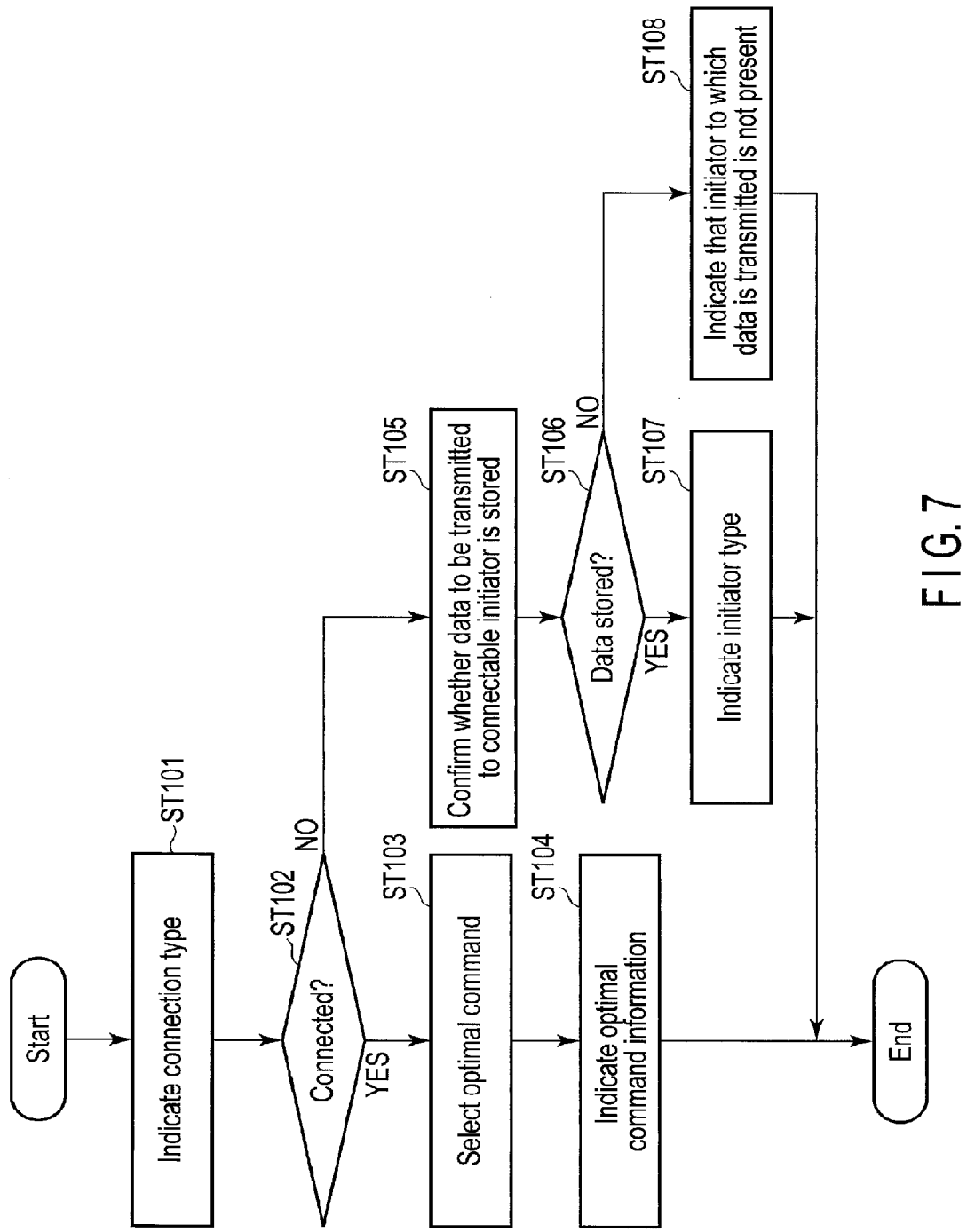
FIG. 7 is a flowchart showing an example of an operation of a command manager according to the first embodiment.

FIG. 7 shows an example of an operation of the data buffer transmission controller 14. It should be noted that the processing of selecting an optimal command of communication port 15A will be described as a representative again. The processing of the other communication ports 15B-15N is similar to that of communication port 15A.

The command manager 21 receives notification (reference request) including a connection type (presence of connection) from the connection manager 22 (ST101). The command manager 21 determines whether communication port 15A is connected to the initiator 200 or not based on the notification (ST102). The reference request includes, for example, the presence of connection, a port type, and an initiator type of the initiator 200 being connected if it is connected.

If the command manager 21 determines that communication port 15A is connected to the initiator 200 (YES in ST102), a read command to be first processed with respect to the initiator 200 being connected (optimal command) is selected using the initiator type included in the reference request (ST103).

Figure 8:
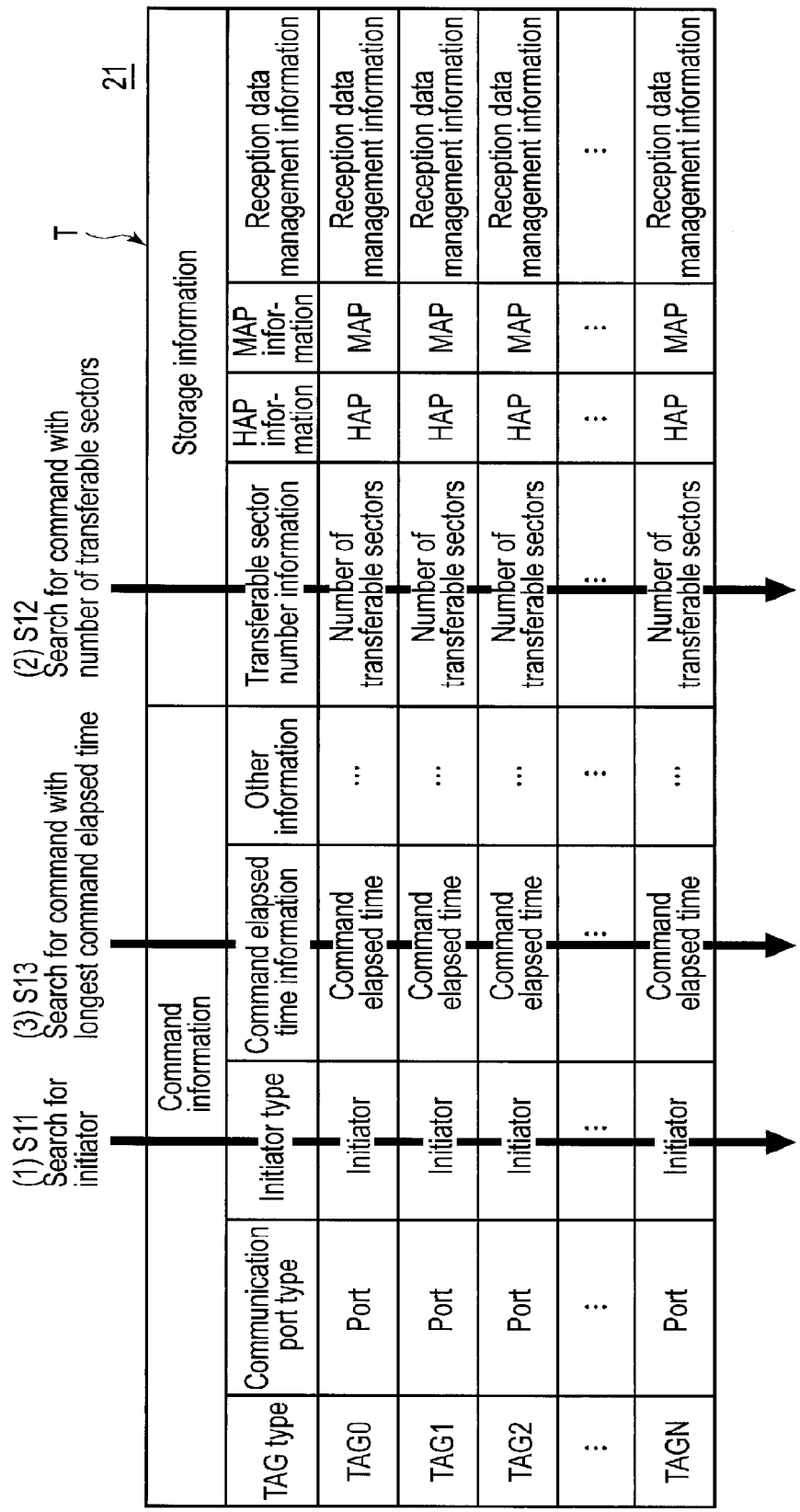
FIG. 8 schematically shows an example of a process in which an optimal command is selected by the command manager when notification indicating a connection is received, according to the first embodiment.

FIG. 8 shows an example of processing of selecting an optimal command. The command manager 21 selects an optimal command from a plurality of read commands based on a connection condition, the command information and the storage information of communication port 15A. In this embodiment, the command manager 21 selects an optimal command based on elapsed time information included in the storage information.

Specifically, the command manager 21 detects whether read commands corresponding to the initiator 200 being connected are present or not using the initiator type of the command information to be managed (S11). That is, read commands associated with identification information identical to the initiator 200 being connected are detected. Thus, read commands (TAG) corresponding to the initiator 200 being connected are extracted. Next, the command manager 21 searches the extracted read commands for commands including the number of transferable sectors (S12). Consequently, the read commands including data which can be transmitted to the initiator 200 being connected are extracted.

Next, the command manager 21 searches read commands including data which can be transmitted to the initiator 200 being connected for a read command with the longest command elapsed time (S13). Then, the command manager 21 selects the read command with the longest command elapsed time as an optimal command from the read commands including data which can be transmitted to the initiator 200 being connected.

Also, the command manager 21 sets the transmission order of a plurality of read commands including data which can be transmitted to the initiator 200 being connected in the order of longer lengths of command elapsed times. As shown in FIG. 7, the command manager 21 indicates optimal command information including the selected optimal command to the connection manager 22 (ST104).

On the other hand, if the command manager 21 determines that communication port 15A is not connected to the initiator 200 (NO in ST102), it confirms whether data to be transmitted to any initiators 200 which can be connected to communication port 15A is stored in the data buffer 12 or not using the communication port type of communication port 15A included in the reference request (ST105).

If the command manager 21 determines that the data to be transmitted is stored (YES in ST106), it selects an initiator 200 to be connected and indicates the initiator type of the initiator 200 to the connection manager 22 (ST107).

The flow from ST105 to ST107 will be further described in detail with reference to FIG. 9. FIG. 9 shows an example of a process in which the command manager 21 selects the initiator 200 when notification indicating no connection is received from the connection manager 22.

As shown in FIG. 9, the command manager 21 searches whether an initiator 200 corresponding to a communication port type identical to that of communication port 15A included in the reference request is present or not using the communication port type in managed command information (S21). Accordingly, an initiator 200 to which communication port 15A is connected is extracted.

Next, the extracted initiators 200 are searched for commands including the number of transferable sectors (S22). As a result, read commands including data which can be transmitted to the connectable initiator 200 are extracted. Next, the command manager 21 searches the read commands including the data which can be transmitted to the connectable initiator 200 for a read command with the longest command elapsed time (S23). Then, the command manager 21 selects the read command with the longest command elapsed time as an optimal command from the read commands including the data which can be transmitted to the connectable initiator 200.

The command manager 21 transmits the initiator type of the initiator 200 corresponding to the selected command to the connection manager 22. When receiving the initiator type from the command manager 21, the connection manager 22 issues an OPEN request to the connection controller 16A. Accordingly, communication port 15A and the initiator 200 are connected. The processing after communication port 15A is connected in this manner is similar to the above-described processing.

On the other hand, as shown in FIG. 7, if the command manager 21 determines that data is not stored in the data buffer 12 (NO in ST106), it indicates that the initiator 200 to which data is transmitted is not present in the connection manager 22 (ST108). In this case, the connection manager 22 issues a CLOSE request to the connection controller 16A.

Next, an example of flows of control signals between the connection controllers 16A-16N, the command manager 21, the connection manager 22, the execution instruction unit 23 and the command execution controllers 17A-17N will be described with reference to FIG. 10. FIG. 10 shows an example of transfer of the control signals.

Each of the connection controllers 16A-16N comprises a function of returning a response such as OPEN_ACCEPT in response to the OPEN request from an initiator 200. Also, each of the connection controllers 16A-16N indicates a connection condition to the connection manager 22. Notification (reference request) of the connection condition includes, for example, the presence of connection, a communication port type and an initiator type.

The connection manager 22 understands a connection condition of each of communication ports 15A-15N based on the reference request indicated by the connection controllers 16A-16N. The connection manager 22 indicates the reference request to the command manager 21 based on the understanding of the connection condition of each of communication ports 15A-15N.

If an initiator 200 being connected is present, the connection manager 22 refers to the command management table T, and confirms whether a sector which can be transmitted to the initiator 200 being connected is present or not. If the sector which can be transmitted is present, the connection manager 22 indicates the initiator type of the initiator 200 being connected as an execution request to the execution instruction unit 23.

The execution instruction unit 23 indicates the initiator type indicated from the connection manager 22 to the command manager 21. If the notification is received from the execution instruction unit 23, the command manager 21 selects an optimal command, and indicates, to the execution instruction unit 23, command information to be transmitted. The execution instruction unit 23 sequentially reads data from the data buffer 12 by indicating command information to the command execution controller 17A-17N. Then, the data frame generator 18A-18N generates a data frame based on the data read from the data buffer 12 to transmit it to the initiator 200.

If the command execution controller 17A-17N transfers data equivalent to the number of data items which can be transmitted (number of transferable sectors) to the initiator 200 based on execution information indicated from the execution instruction unit 23, it indicates completion notification of data transfer to the execution instruction unit 23. By such processing, the plurality of data items of the predetermined unit stored in the data buffer 12 in response to a command are collectively transmitted to the initiator 200 being connected regardless of the storing order in the data buffer 12.

After this, as long as the connection to the initiator 200 continues, the memory system 100 repeats the above transmission operation, and continuously transmits another or other commands of the same initiator 200 (initiator 200 being connected). As a result, a plurality of data items corresponding to a plurality of commands and to be transmitted to the same initiator 200 are collectively transmitted from the data buffer 12.

Also, if the connection is being closed, the connection manager 22 refers to the command management table T, and searches whether data corresponding to unfinished commands stored in the data buffer 12 is stored or not. If the data corresponding to the unfinished commands is present, the connection manager 22 indicates the initiator type of the command to a connection controller 16A-16N and issues an OPEN request.

The connection controller 16 transmits an OPEN address frame to the initiator 200 which the indicated initiator type shows in response to the received OPEN request. When a connection is established, the connection manager 22 indicates command information corresponding to the unfinished commands to a command execution controller 17A-17N through the execution instruction unit 23. Then, data transfer from the data buffer 12 to the initiator 200 is started. The data frame generators 18A-18N sequentially perform data transmission in accordance with command information of a command execution controller 17A-17N, a transmission start address of the data buffer 12 and the number of transmittable bytes.

Figure 11:
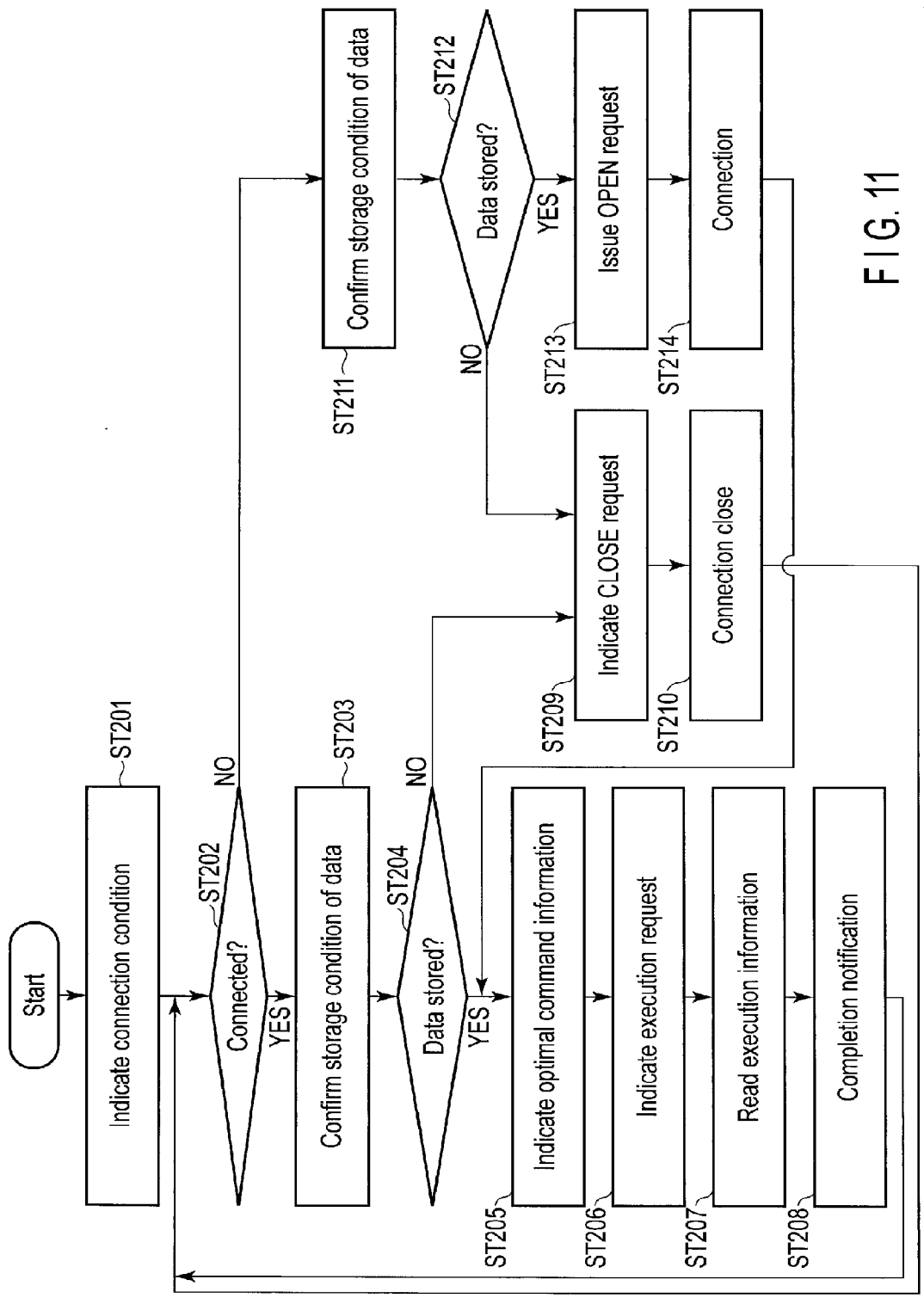
FIG. 11 is a flowchart showing an example of data transmission control of a memory system according to the first embodiment.

FIG. 11 shows an example of data transmission control of the memory system 100. It should be noted that the processing concerning communication port 15A will be described as a representative again. Similar processing is performed also in the other communication ports 15B-15N.

As shown in FIG. 11, the connection the controller 16A indicates a connection condition to the connection manager 22 (ST201). The connection manager 22 detects the presence of connection between communication port 15A and an initiator 200 based on connection conditions indicated from the connection controller 16A (ST202). If the connection manager 22 determines that communication port 15A is in a connection state (YES in ST202), it confirms with the command manager 21 whether data to be transferred to the initiator 200 which is connected to communication port 15A is stored in the data buffer 12 or not (ST203).

The command manager 21 determines whether data to be transmitted to the initiator 200 being connected is stored in the data buffer 12 or not (ST204). If the command manager 21 determines that the data is stored in the data buffer 12 (YES in ST204), it indicates optimal command information to the connection manager 22 (ST205).

The connection manager 22 indicates an execution request to the execution instruction unit 23 (ST206). The execution instruction unit 23 reads execution information from the command manager 21 based on the execution request. The execution instruction unit 23 indicates the read execution information to the command execution controller 17A (ST207).

The command execution controller 17A transfers data equivalent to transferable sectors based on the execution information, and indicates completion notification to the execution instruction unit 23 when the transfer ends (ST208). Then, the processing returns to step ST202.

On the other hand, in step ST204, if the command manager 21 determines that data is not stored in the data buffer 12 (NO in ST204), the command manager 21 transmits notification of no data to the connection manager 22. The connection manager 22 which received the notification indicates a CLOSE request to the connection controller 16A (ST209). The connection controller 16A closes the connection between communication port 15A and the initiator 200 by a CLOSE sequence (ST210). Then, the processing returns to step ST202.

Also, in step ST202, if the connection manager 22 determines that a connection between communication port 15A and the initiator 200 is not present (NO in ST202), it confirms storage conditions of data concerning read commands corresponding to communication port 15A with the command manager 21 (ST211).

The command manager 21 determines whether the data of the read commands corresponding to communication port 15A is stored in the data buffer 12 or not (ST212). If the command manager 21 determines that the data is stored in the data buffer 12 (YES in ST212), an OPEN request is issued to the connection controller 16A to connect the data to the initiator 200 to be transmitted (ST213).

The connection controller 16A establishes a connection to the initiator 200 through communication port 15A by an OPEN sequence (ST214). The processing returns to step ST205, and subsequent processing is performed as described above.

It should be noted that the command manager 21 determines in step ST212 that data is not stored in the data buffer 12 (NO in ST212), the processing returns to already-described step ST209, and subsequent processing is performed as described above.

According to the memory system 100 having such a structure, data transfer efficiency can be improved. Here, a memory system in which data corresponding to read commands received from an initiator is sequentially stored from a non-volatile memory to a data buffer, and the data is transmitted to the initiator in the storing order is considered for comparison. To improve read efficiency from the non-volatile memory, data corresponding to a plurality of read commands is read in parallel from the non-volatile memory. Thus, the storing order in a data buffer is not guaranteed. In the case where data of different initiators are mixed and stored in a data buffer, when data transmission is controlled in the storing order in the data buffer, connection operations need to be performed for each initiator. Thus, connection operations may frequently occur depending on the storage conditions of the data in the data buffer.

On the other hand, the memory system 100 of this embodiment comprises an interface (communication port 15A) which can be connected to the plurality of initiators 200, a storage (data buffer 12) configured to store data, and a controller configured to refer to a connection condition of the interface and transmit data to be transmitted to an initiator 200 being connected from the storage. Such a structure allows the number of connection operations to be reduced, since a lot of data (a plurality of data items) can be transmitted in one connection. Accordingly, the data transfer efficiency can be improved.

In this embodiment, the controller refers to a connection condition of the interface and continuously transmits a plurality of data items corresponding to a plurality of commands and to be transmitted to an initiator 200 being connected from the storage regardless of the storing order in the storage. According to such a structure, a plurality of data items corresponding to a plurality of commands can be transmitted in one connection, and the number of connection operations can be further reduced.

In the storage of this embodiment, a plurality of data items are read in parallel from the memory, and temporarily stored for each predetermined unit in response to commands from the plurality of initiators 200. The controller continuously transmits the plurality of data items of the predetermined unit to be transmitted to an initiator 200 being connected from the storage based on an output from the connection manager 22 regardless of the storing order in the storage. According to such a structure, the plurality of data items of the predetermined unit can be continuously transmitted from the storage in one connection, and the number of connection operations can be reduced.

In the storage of this embodiment, the first data D1 to be transmitted to the first initiator 200A, the second data D2 to be transmitted to the second initiator 200B, and the third data D3 to be transmitted to the first initiator 200A are read from the memory in this order and stored. When the connection manager 22 detects that the first initiator 200A is connected, the controller continuously transmits the first data D1 and the third data D3 to the first initiator 200A. Such a structure allows the third data D3 to be transmitted using a connection for transmitting the first data D1. Accordingly, the number of connection operations can be reduced.

In this embodiment, when the interface and the first initiator 200A are connected in response to the request from the first initiator 200A, the controller detects the presence of data to be transmitted to the first initiator 200A in the storage, and if data to be transmitted to the first initiator 200A is present, the controller transmits the data to the first initiator 200A. Such a structure allows the data to be transmitted to the first initiator 200A to be transmitted using a connection according to a request (for example, write request) from the first initiator 200A. Accordingly, the number of connection operations can be reduced.

In this embodiment, the memory system 100 further comprises the command manager 21 configured to manage commands from the plurality of initiators 200 and data stored in the storage in response to the commands in association with each other. When transmitting a data item of a predetermined unit corresponding to a command to an initiator 200 being connected based on an output from the command manager 21, the controller continuously transmits another data item of the predetermined unit corresponding to the same command to the initiator 200 being connected. According to such a structure, it can collectively transmit a plurality of data items (plurality of data items of a predetermined unit) corresponding to a command in one connection. That is, in this embodiment, it can manage and transmit an amount of data which can be transmitted in a command unit. Thus, the number of connection operations can be reduced.

In this embodiment, the controller continuously transmits a plurality of data items corresponding to a plurality of commands and to be transmitted to an initiator 200 being connected from the storage based on an output from the connection manager 22. According to such a structure, first data corresponding to a first command and second data corresponding to a second command can be collectively transmitted in one connection. Thus, the number of connection operations can be reduced.

In this embodiment, the command manager 21 selects a command to be processed earliest based on a connection condition of the interface and the command information. Such a structure allows data corresponding to an optimal command to be transmitted from data to be transmitted to an initiator 200 being connected. Consequently, an optimal transfer order can be set, and the data transfer efficiency can be further improved.

In this embodiment, the command information includes elapsed time information indicating an elapsed time from reception of the command. The command manager 21 selects a command to be processed earliest based on at least a connection condition of the interface and the elapsed time information. Such a structure allows data corresponding to a command to be given priority to be transmitted to the initiator 200 based on the elapsed time from the reception of the command. Thus, the data transfer efficiency can be further improved.

In this embodiment, the command manager 21 selects a command with the longest elapsed time of commands from an initiator 200 being connected as a command to be processed earliest. According to such a structure, data corresponding to the command with a longer elapsed time from the reception of the command can be preferentially transmitted to the initiator 200. Thus, the data transfer efficiency can be further improved.

Second Embodiment

Next, the memory system 100 according to a second embodiment will be described. It should be noted that a structure having a function identical or similar to that of the structure of the first embodiment will be denoted by the same reference numbers, and its description will be omitted. Also, the structures other than those to be described below are identical to those in the first embodiment.

FIG. 12 shows an example of a process in which the command manager 21 according to this embodiment selects an optimal command. The command manager 21 selects the optimal command based on the number of transferable sectors included in the storage information. It should be noted that the number of transferable sectors is an example of transferable amount information and data size information.

As shown in FIG. 12, after the command manager 21 finishes the processing of step S31 substantially identical to the above step S21 (see FIG. 9), the command manager 21 selects the optimal command based on the number of transferable sectors (data size information) included in storage information (S32). It should be noted that after the command manager 21 finishes the processing of the step substantially identical to the above step S11 (see FIG. 8) instead of this, the command manager 21 may select the optimal command based on the number of transferable sectors (data size information) included in the storage information.

For example, the command manager 21 selects a read command with the largest number of transferable sectors (with the largest transferable amount) as an optimal command based on the number of transferable sectors. According to such a structure, the memory system 100 can quickly make room for a data storage area of the data buffer 12.

Also, the command manager 21 may select a read command with the smallest number of transferable sectors (with the smallest transferable amount) as an optimal command based on, for example, the number of transferable sectors, or may select a read command to average the number of sectors to be transferred in one connection.

Furthermore, the memory system 100 may comprise a register 21*a* (indicated by broken lines in FIG. 1) configured to determine processing for selecting an optimal command in, for example, the command manager 21. The register 21*a* is an example of a setting module in which a user can set a method of selecting an optimal command. According to such a structure, a user of, for example, the memory system 100 can change methods of selecting an optimal command in accordance with an individual situation. This increases convenience of the memory system 100.

The memory system 100 according to such a structure allows the transfer efficiency of data to be increased as well as in the first embodiment.

In this embodiment, the command manager 21 manages command information of the command and storage information of data stored in the storage in response to the commands in association with each other, and selects a command to be processed earliest based on a connection condition of the interface, the command information and the storage information. Such a structure allows an appropriate transfer order to be determined based on the storage information, etc., and data transfer efficiency can be improved.

In this embodiment, the storage information includes transferable amount information of data stored in the storage in response to a command. The command manager selects a command to be processed earliest based on at least a connection condition of the interface and the transferable amount information. Such a structure allows an appropriate transfer order to be determined based on the transferable amount information, and the data transfer efficiency can be further improved.

In this embodiment, the command manager selects a command with the largest transferable amount of commands from the initiator 200 being connected as a command to be processed earliest. Since such a structure allows an amount of data which can be transmitted to the initiator 200 in one connection to be increased, the number of connections can be reduced.

Third Embodiment

A memory system according to a third embodiment comprises a plurality of nonvolatile memories. This memory system executes read operations on the plurality of nonvolatile memories in parallel, thereby reading a plurality of read data items from the nonvolatile memories in a random order. If the memory system uses an interface (such as an SAS interface), which requires a plurality of read data items to be transmitted in order to an initiator, it needs to rearrange the read data items. In the third embodiment, a description will be given of rearrangement of read data read by the memory system in a random order.

In the third embodiment, a rearrangement example of read data will be described first, and thereafter, a read data rearrangement according to the third embodiment will be described.

(Read-Data Rearrangement Example)

FIG. 13 is a block diagram showing a memory system example 400 for rearranging read data. FIG. 13 shows only structural elements relevant to read operation, and those irrelevant to the read operation are omitted.

The memory system 400 is, for example, an SSD, and is connected to an initiator 401. The memory system 400 comprises a command manager 402, a queue manager 403, a buffer manager 404, and a plurality of nonvolatile memories 10A to 10M.

The command manager 402 manages commands received from the initiator 401, using a command management table 402T.

The queue manager 403 manages a queue management table 403T for queuing commands, between the command manager 402 and the buffer manager 404.

The buffer manager 404 temporarily stores, in a data buffer 404B, read data RD read from nonvolatile memories 10A to 10M, then rearranges them appropriately, and then transmits, to the initiator 401, the read data RD in the data buffer 404B.

The data transfer rate required for the memory system 400 to transfer data to the initiator 401 is increasing year after year. To deal with the increasing data transfer rate, the memory system 400 comprises nonvolatile memories 10A to 10M. After executing a read operation, the memory system 400 is able to perform concurrent read access to nonvolatile memories 10A to 10M, and thereby is able to read read data RD in a random order from the from nonvolatile memories 10A to 10M.

If an interface that is required to transmit a plurality of read data items RD to the initiator 401 is applied to the memory system, the memory system 400 employs the data buffer 404B. The data buffer 404B temporarily stores read data items RD read from the nonvolatile memories 10A to 10M, then rearranges them using a sort table ST, and then transmits the rearranged read data items RD to the initiator 401.

The command manager 402 receives a read command RC from the initiator 401, and stores the command information of the read command RC in the command management table 402T.

The command management table 402T associates, for example, command information which includes command identification information that indicates the read command RC (command ID), the number of clusters included in the read command RC, LBA values, etc.

In the embodiment, the cluster is a basic unit for storing data in nonvolatile memories 10A to 10M. A cluster count is the number of clusters. The cluster count included in the read command RC corresponds to the cluster count of read target data read by the read command RC.

In the embodiment, the buffer manager 404 is configured to be able to concurrently read, from the nonvolatile memories, read data RD corresponding to one cluster.

After determining the order of command execution, the command manager 402 transmits a command (a command queue) to the queue manager 403.

The queue manager 403 queues the command information corresponding to the command in the queue management table 403T. After queuing the command information in the queue management table 403T, the queue manager 403 issues command by command, to the buffer manager 404, read requests NR requesting reading of data from the nonvolatile memories 10A to 10M.

The number of read requests NR to be issued corresponds to the number of clusters which are read by read commands RC, and read data RD corresponding to one cluster is read in accordance with one read request NR.

The read request NR includes a command ID, a cluster count, LBA values, etc. managed using the command management table 402T.

Upon receiving a read request NR, the buffer manager 404 reads read data RD from a nonvolatile memory that is included in nonvolatile memories 10A to 10M and stores the read data RD, and stores it in the data buffer 404B. Whenever it has received a read request NR, the buffer manager 404 reads read data RD, stores it in the data buffer 404B, and rearranges the read data RD in the data buffer 404B in an order in which the read data can be transmitted to the initiator 401. At this time, the buffer manager 404 may rearrange the read data RD based on, for example, LBA values.

After reading read data RD corresponding to all clusters included in one read command RC, and rearranging the same, the buffer manager 404 issues, to the queue manager 403, a read data ready (RDR) notification indicating that the read data RD can be transmitted to the initiator 401.

Upon receiving the read data ready notification RDR, the queue manager 403 issues a buffer read (BR) request to the buffer manager 404.

Upon receiving the buffer read request BR, the buffer manager 404 transmits the read data RD to the initiator 401.

Figure 14:
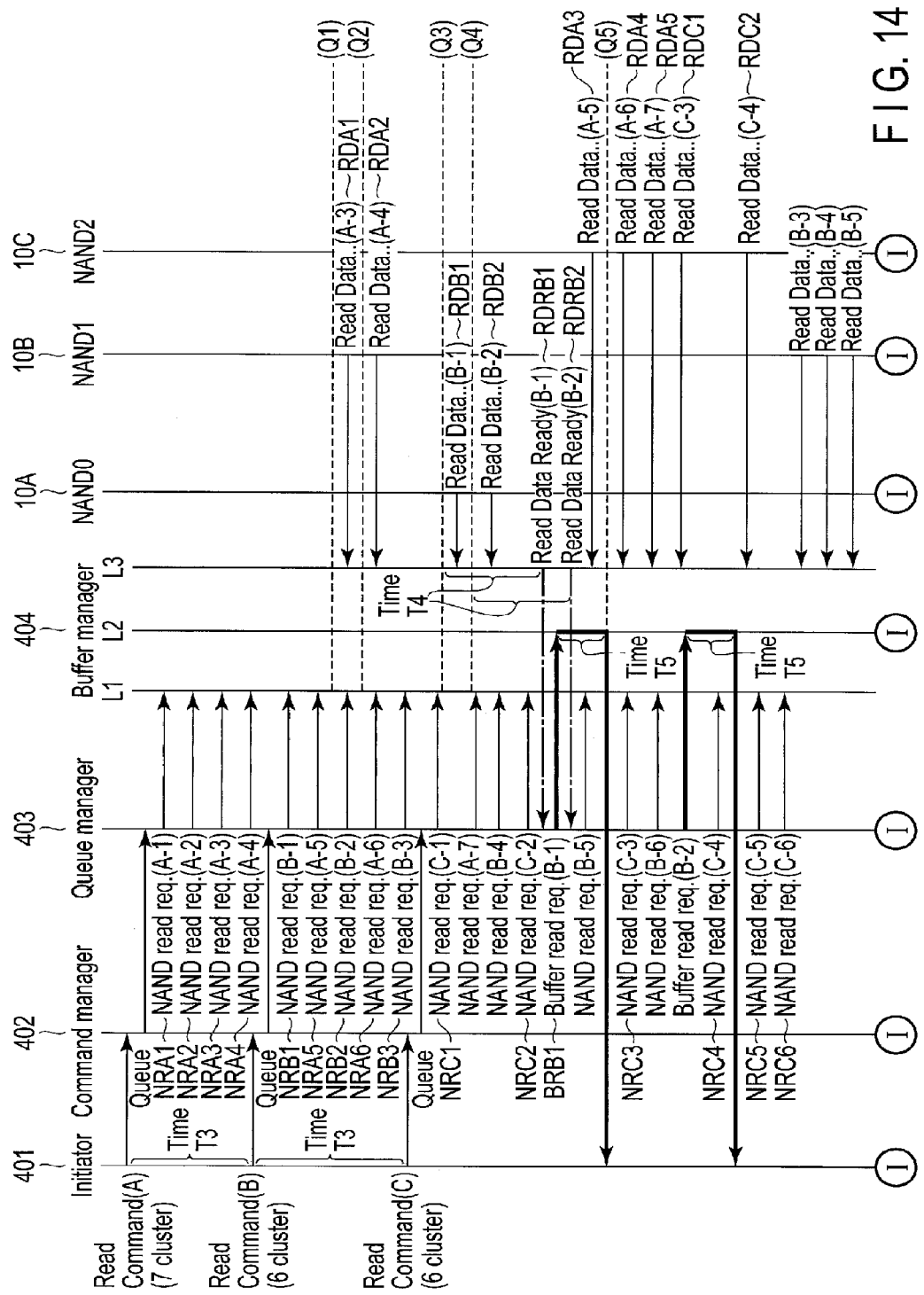
FIG. 14 shows a first example of a rearrangement of read data RD.

FIG. 14 shows a first example of the rearrangement of the read data RD.

Figure 15:
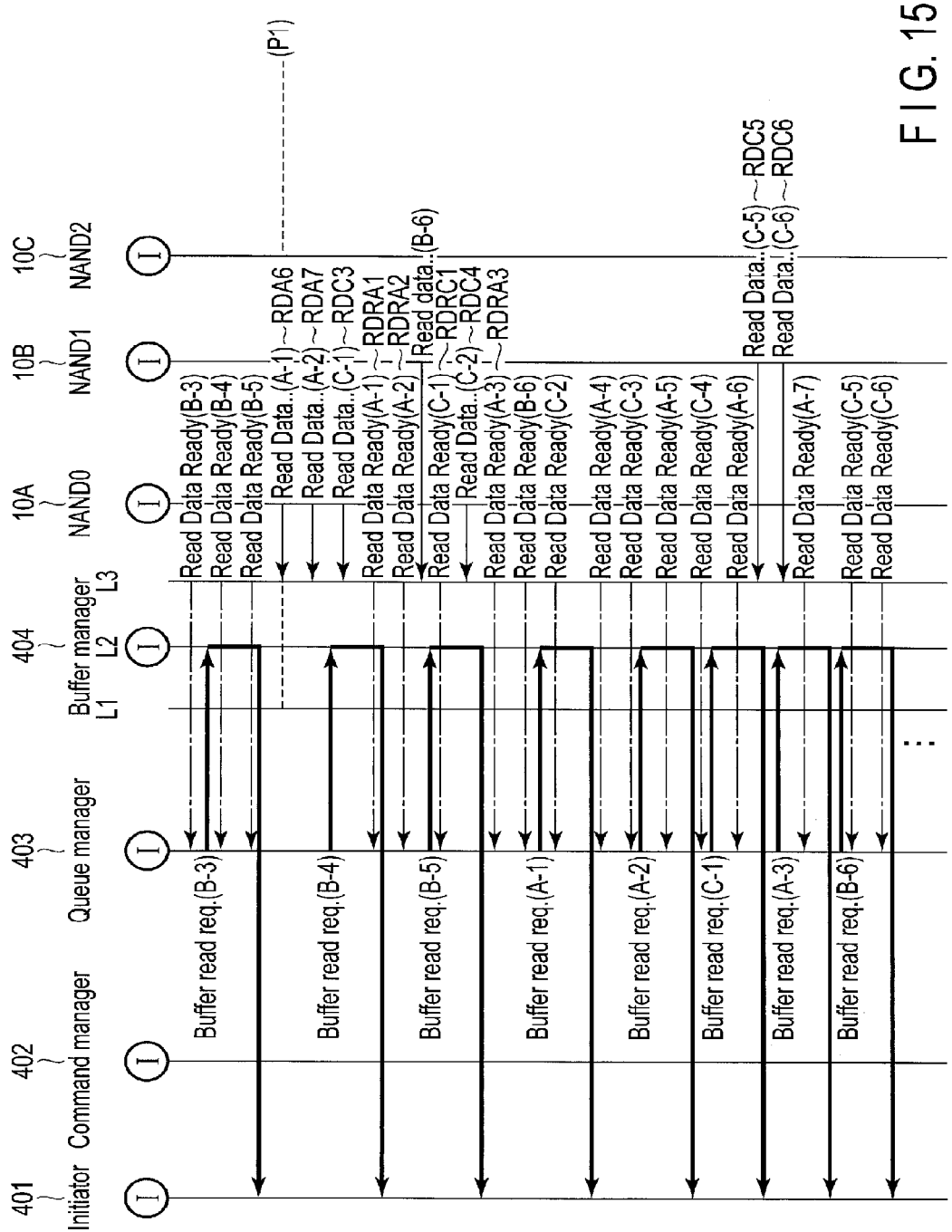
FIG. 15 shows a second example of the rearrangement of the read data RD.

FIG. 15 shows a second example of the rearrangement of the read data RD.

FIGS. 14 and 15 show the rearrangement of a series of read data RD, and the head of FIG. 15 is connected to the end of FIG. 14.

Assume here that the example of FIGS. 14 and 15 employs three nonvolatile memories (10A to 10C) and three read commands RC (read commands A, B and C). Assume also that the cluster count of read command A is 7, the cluster count of read command B is 6, and the cluster count of read command C is 6.

In FIGS. 14 and 15, each cluster is identified by the combination of the type of read command RC and the cluster count. For example, the first cluster of read command A is expressed as "A-1".

Moreover, in FIGS. 14 and 15, the functionality of the buffer manager 404 is divided among three types of units (a read request receive unit L1, a data transmit unit L2 and a read unit L3). The read request receive unit L1 receives a read request NR from the queue manager 403. The data transmit unit L2 receives a buffer read request BR from the queue manager 403, and transmits read data RD to the initiator 401. The read unit L3 receives read data RD from nonvolatile memories 10A to 10C, stores it in the data buffer 404B, and issues a read data ready notification RDR to the queue manager 403. Note that the read request receive unit L1, the data transmit unit L2 and the read unit L3 are defined for convenience, and the buffer manager 404 may not be always divided into the above-mentioned processing units.

Although FIGS. 14 and 15 show various read commands, read requests, read data, read data ready notifications and buffer read requests, a description will hereinafter be given of only part of them for simplification of description.

First, the initiator 401 issues read commands A to C to the command manager 402 at intervals of time T3. Time T3 may differ between the commands.

The command manager 402 stores command information corresponding to read commands A to C in the command management table 402T, and issues, to the queue manager 403, commands corresponding to read commands A to C.

The queue manager 403 queues the command information corresponding to each command in the queue management table 403T, and issues a read request NR cluster by cluster corresponding to each command.

The command corresponding to read command RC may be directly input to the queue manager 403, without being passed through the command manager 402. In this case, the command manager 402 may be omitted.

The read requests NR are issued in order of cluster number. If two or more pieces of command information are queued in the queue management table 403T, the read requests NR are alternately issued command by command, corresponding to a piece of the queued command information. For example, in FIG. 14, if only command information corresponding to read command A is queued in the queue management table 403T, read requests NRA1 to NRA4 are issued in the order "A-1", "A-2", "A-3" and "A-4". After that, if command information corresponding to read command B is queued in the queue management table 403T, read requests NRA5 to NRA6 and NRB1 to NRB3 are issued in the order "B-1", "A-5", "B-2", "A-6" and "B-3".

After receiving a read request NR from the queue manager 403, the read request receive unit L1 receives read data RD from nonvolatile memories 10A to 10C. Note that the order of read data items RD received by the read unit L3 may differ from the order of read requests NR received by the read request receive unit L1. For instance, in FIGS. 14 and 15, read requests NRC1 to NRC6 of read command C are issued from the queue manager 403 to the read request receive unit L1 in the order "C-1", "C-2", "C-3", "C-4", "C-5" and "C-6", namely, in order of cluster number. In contrast, read data items RDC1 to RDC6 are transmitted from the nonvolatile memories 10A to 10C to the read unit L3 in the order "C-3", "C-4", "C-1", "C-2", "C-5" and "C-6".

The read data RD needs to be transmitted to the initiator 401 in order of cluster number. Accordingly, even when, for example, read data RDA1 of "A-3" is received and stored in the data buffer 404B, the read unit L3 waits for reception of read data items RDA6 and RDA7 of "A-1" and "A-2", and issues read-data ready notification RDRA3 corresponding to "A-3" after issuing read-data ready notifications RDRA1 and RDRA2 corresponding to "A-1" and "A-2".

Assume here that there are no limitations between different commands regarding the order of issuing of read-data ready notification RDR.

Upon receiving the read-data ready notification RDR, the queue manager 403 issues buffer read requests BR to the data transmit unit L2 of the buffer manager 404 in order of the read-data ready notification RDR received. The data transmit unit L2 transmits corresponding read data RD to the initiator 401. For instance, in FIG. 14, after receiving read-data ready notification RDRB1 corresponding to "B-1", the queue manager 403 issues buffer read request BRB1. The data transmit unit L2 receives buffer read request BRB1, and transmits, to the initiator 401, read data RDB of "B-1".

The above-described procedure is repeated until transmission of read data RD to the initiator 401, which corresponds to all read requests NR issued by the queue manager 403, is completed.

Further, in the embodiment, until the read unit L3 transmits a read-data ready notification RDR to the queue manager 403 after receiving read data RD from the nonvolatile memories 10A to 10C, a delay of arbitrary period T4 is introduced in consideration of processing of the buffer manager 404 even when no other read data RD is being waited for. However, period T4 may be omitted.

Furthermore, until the data transmit unit L2 transmits read data RD to the initiator 401 after receiving a buffer read request BR from the queue manager 403, a delay of arbitrary period T5 is introduced in consideration of processing of the buffer manager 404. However, period T5 may be omitted.

Figure 16:
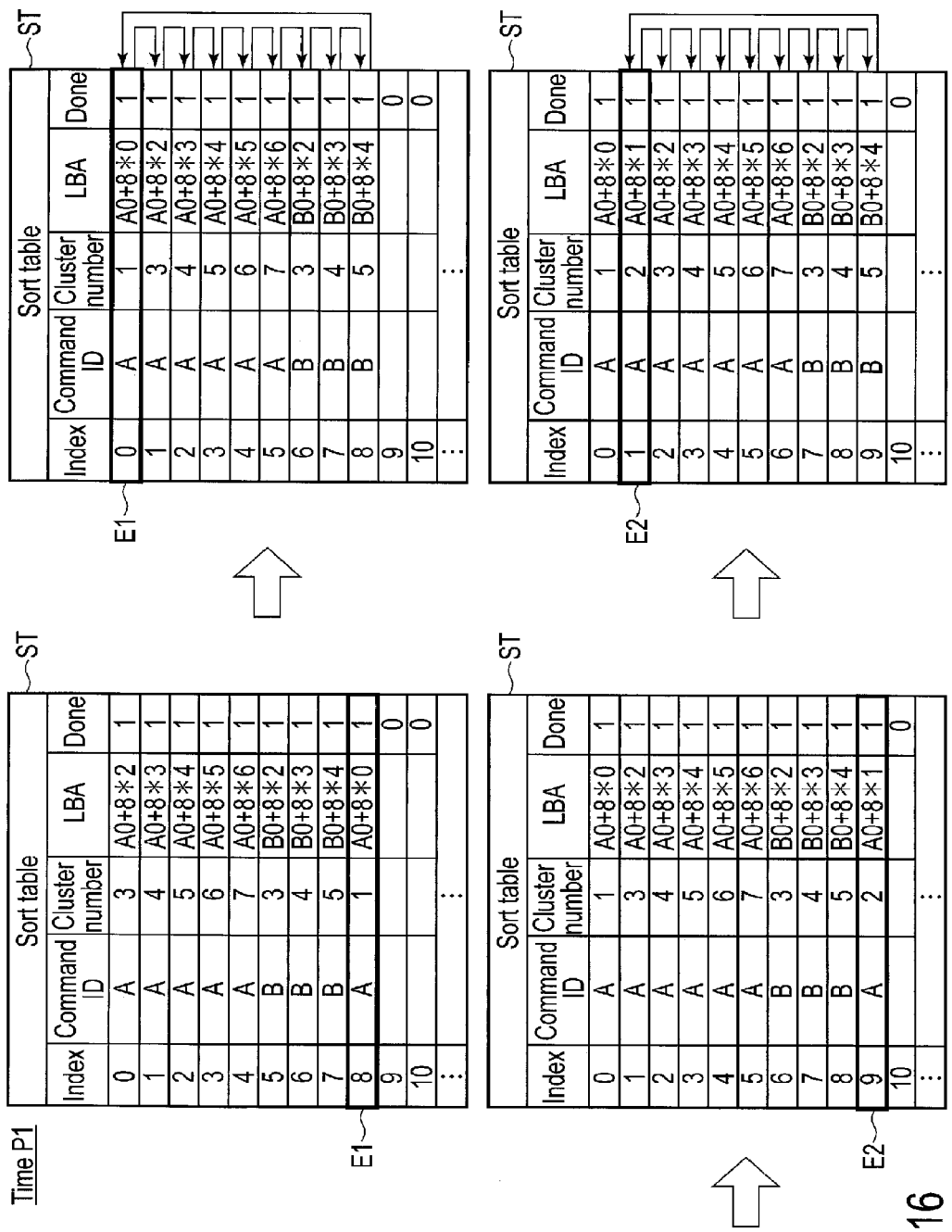
FIG. 16 shows an example of state change on a sort table that is included in the buffer manager.

FIG. 16 shows an example of state change on a sort table ST that is included in the buffer manager 404.

Specifically, a description will be given of a method of detecting whether read data RD, which can be transmitted to the initiator 401, has been stored in the data buffer 404B, when the buffer manager 404 (i.e., the read unit L3 shown in FIGS. 14 and 15) issues a read-data ready notification RDR to the queue manager 403.

The buffer manager 404 comprises a sort table ST. The sort table ST stores read data RD read from the nonvolatile memories 10A to 10M. Whenever new information (entry) is added to the sort table ST, the buffer manager 404 rearranges all entries in order of cluster number. FIG. 16 shows state change on the sort table ST when read data RDA6 of "A-1" and read data RDA7 of "A-2" are stored in the data buffer 404B at time P1 in FIG. 15.

Upon receiving read data RDA6, the buffer manager 404 stores it in the sort table ST (entry E1). Next, the buffer manager 404 calculates an LBA value from the command ID and the cluster number of entry E1, and changes the position of entry E1 in the sort table ST so that the lowest one of all LBA values is positioned at the head. In FIG. 16, since the LBA value of entry E1 is lowest, the buffer manager 404 positions entry E1 at the head of the sort table ST.

Similarly, the buffer manager 404 receives read data RDA7, and stores it in the sort table ST (entry E2). The buffer manager 404 calculates the LBA value of entry E2, and positions entry E2 in a suitable position in the sort table ST. In the example of FIG. 16, the buffer manager 404 positions entry E2 next to entry E1.

However, in order to realize rearrangement processing as mentioned above, a huge circuit scale is required. The embodiment employs a structure that enables rearrangement of read data with a small circuit scale. This structure will now be described.

(Rearrangement of Read Data According to the Embodiment)

Figure 17:
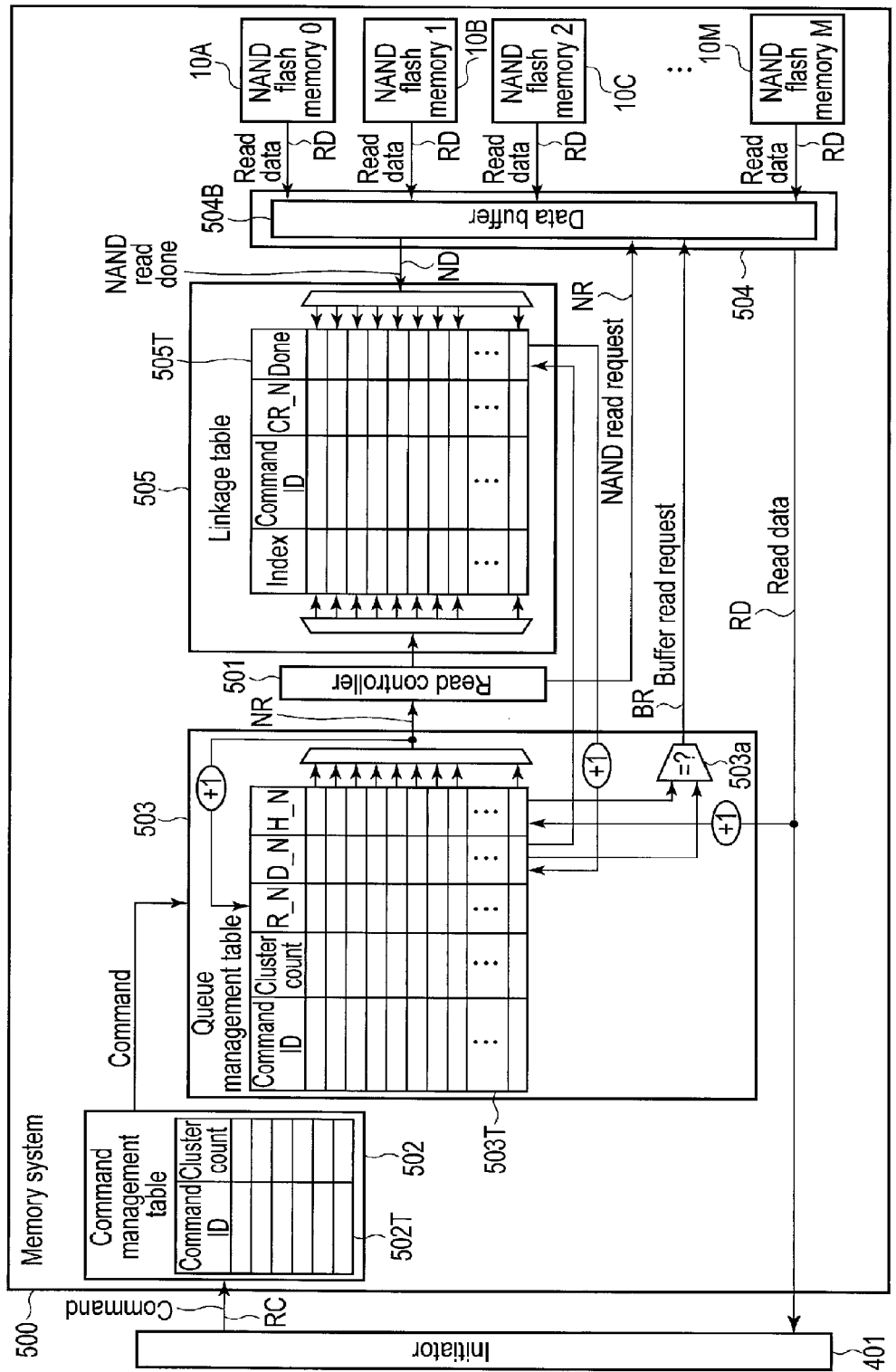
FIG. 17 is a block diagram showing a memory system example for rearranging read data according to the third embodiment.

FIG. 17 is a block diagram showing an example of the memory system for rearranging read data, according to the embodiment. FIG. 17 only shows structural elements relevant to a read operation, and omits elements irrelevant to the read operation.

A memory system 500 is, for example, an SSD, and is connected to the initiator 401. The memory system 500 comprises a read controller 501, a command manager 502, a queue manager 503, a buffer manager 504, a linkage unit 505, and a plurality of nonvolatile memories 10A to 10M.

The difference between the memory system 500 and the memory system 400 will be described.

The queue manager 503 generates, by a read command RC received from the initiator 401, a plurality of read requests NR corresponding to a plurality of read-unit data (i.e., a cluster or read data RD) read by a read command RC and manages a queue management table 503T indicating a state of transmission of a plurality of clusters to the initiator 401.

The queue management table 503T associates, for example, read command RC by read command RC, a read-request issuance count R_N, a read completion count D_N and a transmission completion count H_N, in addition to the command ID and the cluster count managed using the above-mentioned queue management table 403T. Therefore, each entry of the queue management table 503T includes, for example, a command ID, a cluster count, a read-request issuance count R_N, a read completion count D_N and a transmission completion count H_N.

The read-request issuance count R_N represents a cluster count, which indicates the number of clusters to which read requests NR have already been issued among the number of clusters included in the read command RC. The read completion count D_N represents a cluster count, which indicates the number of clusters that have already been read from the nonvolatile memories 10A to 10M to the data buffer 504B among the number of clusters included in the read command RC. The transmission completion count H_N represents a cluster count, which indicates the number of clusters that have already been transmitted from the data buffer 504B to the initiator 401 among the number of clusters included in the read command RC. Assume that the initial values of the read-request issuance count R_N, the read completion count D_N and the transmission completion count H_N are all zero.

Upon receiving a read request NR cluster by cluster from the queue manager 503, the read controller 501 transmits, to the linkage unit 505, cluster information, including a command ID and a number CR_N, linked to the read request NR, and issues a read request NR to the buffer manager 504. The queue manager 503 increments, by one, the read-request issuance count R_N of the read command RC whenever it issues the read request NR to the read controller 501.

When the buffer manager 504 reads a cluster from the nonvolatile memories 10A to 10M and stores it in the data buffer 504B, it issues a read-completion notification ND to the linkage unit 505.

The data buffer 504B temporarily stores the plurality of clusters read from the nonvolatile memories in a random order, based on the plurality of read requests NR.

Further, the buffer manager 504 transmits, based on the queue management table and the linkage table 505T, the plurality of clusters being stored in the storage unit in a random order to the initiator 401 in an order designated by the read command RC.

The linkage unit 505 manages the linkage table 505T indicating whether each of the plurality of clusters has been read from the nonvolatile memories.

Upon receiving the cluster information from the read controller 501, the linkage unit 505 stores them in the linkage table 505T.

The linkage table 505T associates, with each other for each of the plurality of clusters, data identification information (index) of the clusters, the command identification information (command ID), a number CR_N indicating the turn of issuance of a read request included in the plurality of read requests NR corresponding to the plurality of clusters, and read completion information (Done) indicating whether read from the nonvolatile memories 10A to 10M has been completed. Therefore, each entry of the linkage table 505T includes, for example, an index, a command ID, a number CR_N and read completion information Done.

The number CR_N is the read-request issuance count R_N obtained when the linkage unit 505 registers the cluster information in the linkage table 505T. That is, the number CR_N represents that the current read request NR is the $n^{th}$ read request NR (n is a natural number) of the same read command RC. For example, the sequence number CR_N is a value that is incremented by one from zero whenever a read request NR associated with the same read command RC is issued.

Upon receiving a read-completion notification ND from the buffer manager 504, the linkage unit 505 sets a corresponding read completion information. For example, the linkage unit 505 changes read completion information Done of the corresponding entry from zero to one. The read-completion notification ND includes information that indicates to which entry in the linkage table 505T the read data RD corresponds. For example, the read-completion notification ND may include information indicating the type (command ID) of the read command RC, the cluster number (s), etc.

The linkage unit 505 compares, when a command ID of an entry of the queue management table 503T is identical to a command ID of an entry of the linkage table 503T and the read completion information Done of the linkage table 505T indicates a read completion, a read completion count D_N of the entry of the queue management table 503T with a number CR_N of the entry of the linkage table 505T. Further, when the read completion count D_N of the entry of the queue management table 503T is identical to the number CR_N of the entry of the linkage table 505T, the linkage unit 505 permits transmission of the cluster corresponding to the entry of the linkage table 505T.

Furthermore, when a read completion count D_N of an entry of the queue management table 503T differs from a transmission completion count H_N, the queue manager 503 issues, to the buffer manager 504, a buffer read request BR to transmit, to the initiator 401, the cluster corresponding to the entry of the queue management table 503T.

The buffer manager 504 transmits, to the initiator 401, the cluster corresponding to the buffer read request BR, in response to the buffer read request BR.

Further, the command manager 502 and a command management table 502T employed therein are the same as the command manager 402 and the command management table 402T shown in FIG. 13, respectively.

Figure 18:
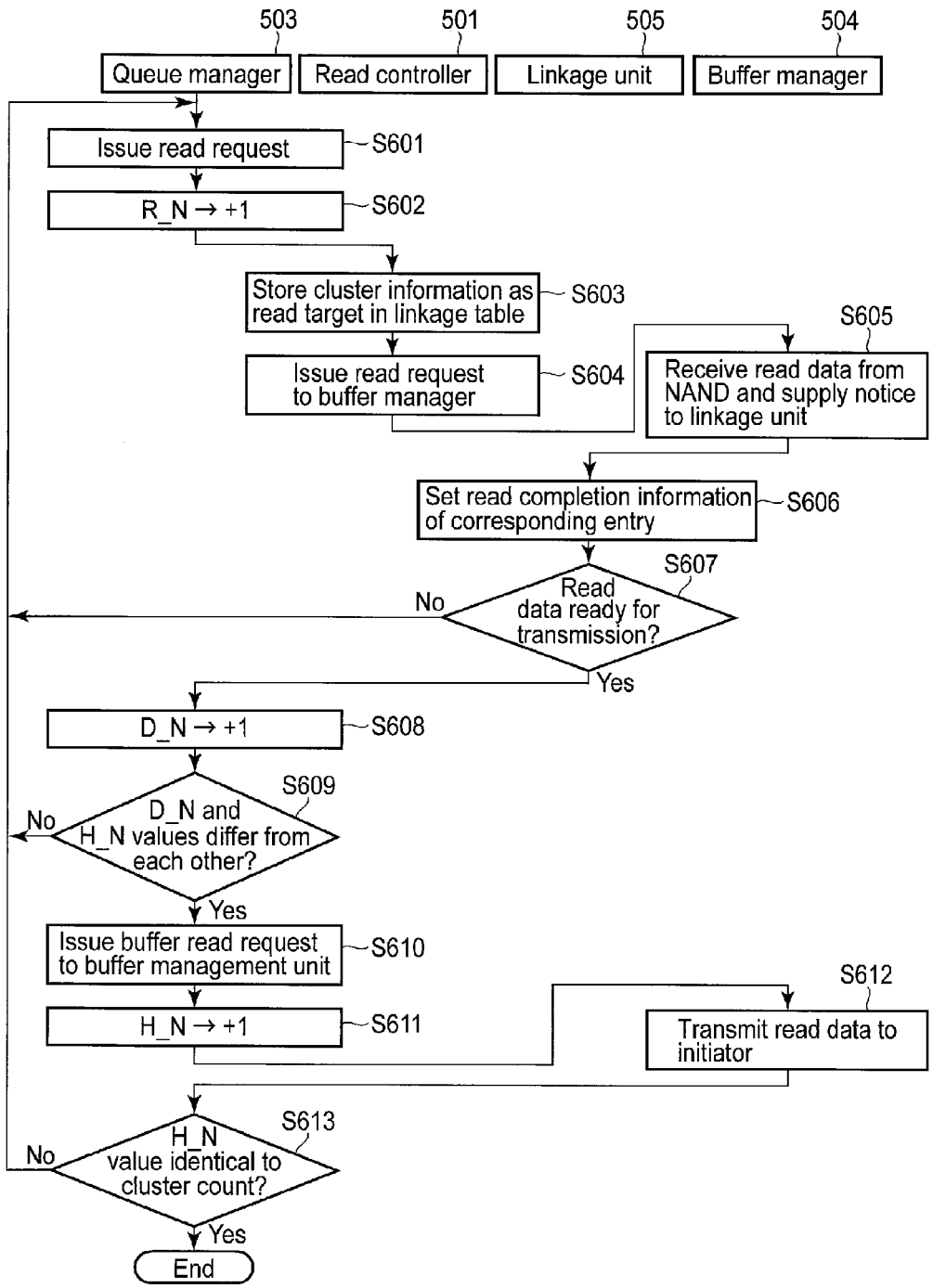
FIG. 18 is a flowchart showing a read-data rearrangement procedure example according to the third embodiment.

FIG. 18 is a flowchart illustrating a read-data rearrangement procedure example according to the embodiment.

In step S601, the queue manager 503 issues a read request NR to the read controller 501.

In step S602, in the queue management table 503T, the queue manager 503 increments, by one, the read-request issuance count R_N corresponding to the read request NR issued in step S601.

In step S603, the read controller 501 receives the read request NR, and transmits cluster information for a read target to the linkage unit 505. The linkage unit 505 stores the cluster information in the linkage table 505T.

In step S604, the read controller 501 issues a read request NR to the buffer manager 504.

Either step S603 or S604 may be executed first, or these steps may be executed concurrently.

In step S605, the buffer manager 504 receives the read request NR issued by the read controller 501 in step S604, and receives read data RD from the nonvolatile memories 10A to 10M. Further, the buffer manager 504 issues a read completion notification ND to the linkage unit 505.

In step S606, the linkage unit 505 sets, to 1, a read completion information Done of the entry corresponding to the received read completion notification ND.

In step S607, the linkage unit 505 checks whether there is read data RD that has been changed into a state in which it can be transmitted to the initiator 401. More specifically, the linkage unit 505 compares the number CR_N of an entry, the read completion information Done of which has been set to 1, with a read completion count D_N notified in real time by the queue manager 503. If the current read completion count D_N is identical to the number CR_N of which read completion information Done has been set to 1, the linkage unit 505 determines that read data RD linked to the entry is ready for transmission, whereby the processing proceeds to step S608. In contrast, if there is no entry of which number CR_N is identical to the current read completion count D_N and of which read completion information Done is one the processing returns to step S601.

In step S608, the linkage unit 505 issues, to the queue manager 503, a request to increment the read completion count D_N by one. In accordance with the request, the queue manager 503 increments the read completion count D_N of a corresponding entry by one. Note that this request corresponds to the above-mentioned read-data ready notification RDR.

In step S609, the queue manager 503 compares the current read completion count D_N with the transmission completion count H_N by a comparator 503a. If the read completion count D_N differs from the transmission completion count H_N, the processing proceeds to step S610. If the read completion count D_N is identical to the transmission completion count H_N, the processing returns to step S601.

In step S610, the queue manager 503 issues, to the buffer manager 504, a buffer read request BR to read read data RD corresponding to an entry determined in step S607 to include transmission ready read data RD.

In step S611, the queue manager 503 increments the transmission completion count H_N by one.

In step S612, the buffer manager 504 receives a buffer read request BR, and transmits, to the initiator 401, read data RD corresponding to the buffer read request BR.

In step S613, the queue manager 503 checks, for all entries managed using the queue management table 503T, whether the transmission completion count H_N is identical to the cluster count. If the transmission completion count H_N is identical to the cluster count in association with all entries, the processing is completed. In contrast, if there is an entry whose transmission completion count H_N and cluster count differ from each other, the processing returns to step S601 to thereby iterate the above-described processing, since transmission of read data RD is not completed.

Figure 19:
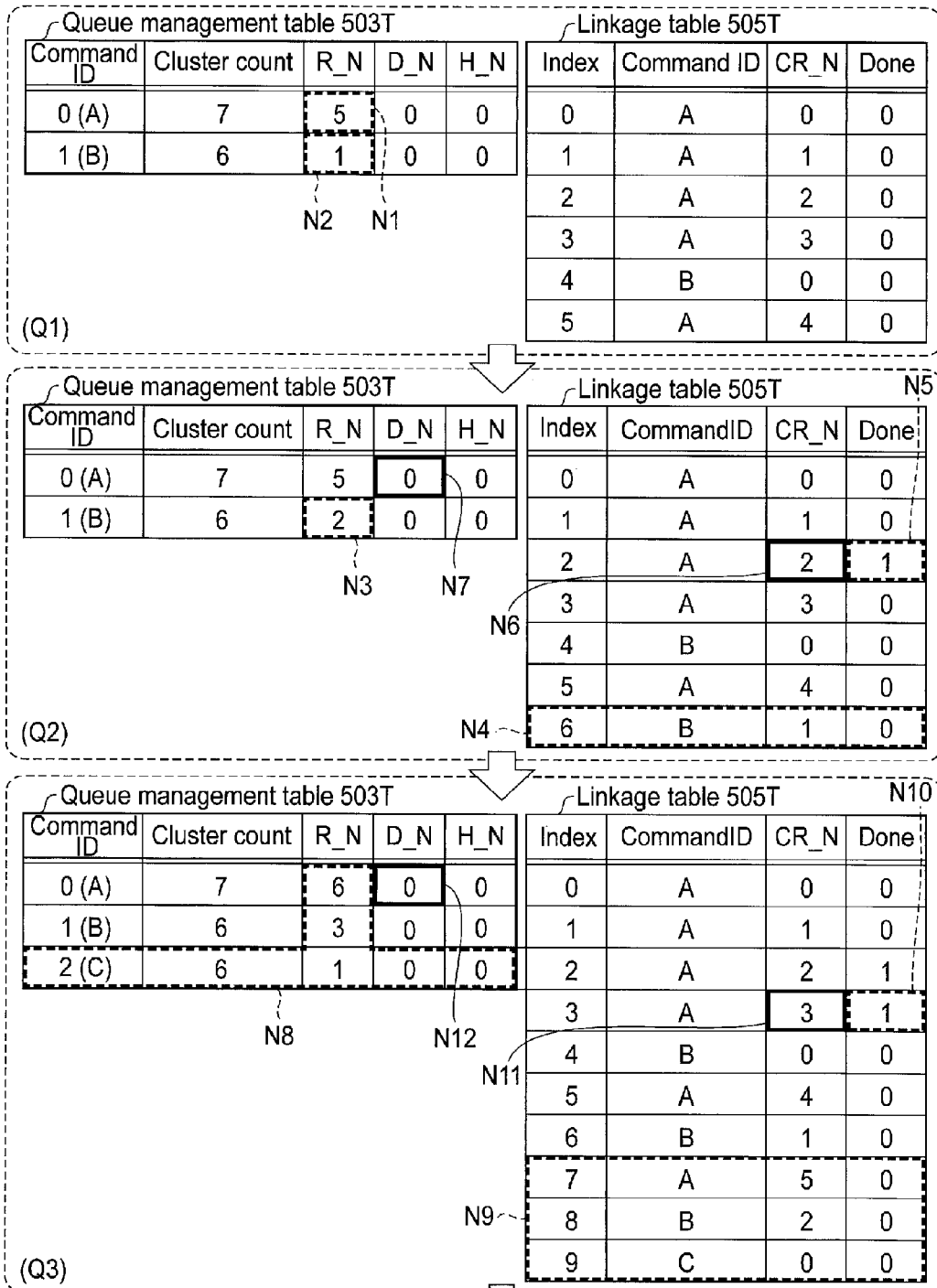
FIG. 19 shows a first example of states of a queue management table and a linkage table according to the third embodiment.

FIG. 19 shows a first example of states of the queue management table and the linkage table employed in the embodiment.

FIG. 20 shows a second example of states of the queue management table and the linkage table employed in the embodiment.

Specifically, FIGS. 19 and 20 show the states of the queue management linkage table 503T and the linkage table 505T assumed at times Q1 to Q5 in FIG. 14 when rearrangement of read data RD has been executed using the embodiment as shown in FIGS. 14 and 15, and the head of FIG. 20 is connected to the end of FIG. 19.

At time Q1, the queue management table 503T manages read commands A and B.

In the case of read command A, at time Q1, read requests NRA1 to NRA5 are already issued and hence the read-request issuance count R_N is five (N1). In the case of read command B, at time Q1, read request NRB1 is already issued and hence the read-request issuance count R_N is one (N2).

Further, cluster information items corresponding to read requests NRA1 to NRA5 and NRB1 are stored in the linkage table 505T in order of issuance. In the embodiment, the cluster number corresponds to number CR_N+1.

At time Q2, read request NRB2 is already issued, whereby the read-request issuance count R_N of read command B in the queue management table 503T is two (N3), and cluster information corresponding to "B-2", of which index is 6 in the linkage table 505T, is stored in the linkage table 505T (N4).

Furthermore, at time Q2, the buffer manager 504 already receives read data RDA1, and hence the read completion information Done of cluster information corresponding to "A-3", of which index is 2 in the linkage table 505T, is set to one in the linkage table 505T (N5). At this time, the linkage unit 505 compares a number CR_N (N6) corresponding to "A-3" with the current read completion number D_N (N7) received from the queue management table 503T. Since they differ from each other, it is determined that read data RDA1 is not ready for transmission.

At time Q3, read requests NRA6, NRB3 and NRC1 are already issued, whereby read command C is added to the queue management table 503T, and the read request issuance counts R_N of read commands A, B and C are increased (N8). Cluster information corresponding to "A-6", of which index is 7 in the linkage table 505T, "B-3", of which index is 8 in the linkage table 505T, and "C-1", of which index is 9 in the linkage table 505T, is stored in the linkage table 505T (N9).

Moreover, at time Q3, the buffer manager 504 already receives read data RDA2, whereby the read completion information Done of cluster information corresponding to "A-4", of which index is 3 in the linkage table 505T, is set in the linkage table 505T (N10). At this time, the linkage unit 505 compares a number CR_N (N11) corresponding to "A-4" with the current read completion number D_N (N12) received from the queue management table 503T. Since they differ from each other, it is determined that read data RDA2 is not ready for transmission.

At time Q4, the buffer manager 504 already receives read data RDB1, whereby the read completion information Done of the cluster information of "B-1", of which index is 4 in the linkage table 505T, is set in the linkage table 505T (N13). At this time, the linkage unit 505 compares a number CR_N (N14) corresponding to "B-1" with the current read completion number D_N (N15) received from the queue management table 503T. Since they are identical to each other, the linkage table 505T determines that read data RDB1 is ready for transmission, thereby transmitting, to the queue manager 503, a request to increment the read completion number D_N by one. The queue manager 503 increments the read completion number D_N by one (N16).

Moreover, the queue manager 503 compares the read completion number D_N (N16) with a transmission completion count H_N (N17). Since they differ from each other, the queue manager 503 issues, to the buffer management 504, buffer read request BRB1 to read read data RDB1. The queue manager 503 increments the transmission completion count H_N by one (N18).

The buffer manager 504 receives buffer read demand BRB1 from the queue manager 503, and transmits read data RDB1 to the initiator 401.

At time Q5, read requests NRA7, NRB4, NRC2 and NRB5 are already issued, whereby the read request issuance counts R_N of read commands A, B and C are increased by one, by two and by one in the queue management table 503T (N19). Cluster information corresponding to "A-7", of which index is 10 in the linkage table 505T, "B-4", of which index is 11 in the linkage table 505T, "C-2", of which index is 12 in the linkage table 505T, and "B-5", of which index is 13 in the linkage table 505T, is newly stored in the linkage table 505T (N20).

Further, at time Q5, the buffer manager 504 already receives read data items RDB2 and RDA3, whereby each read completion information Done of cluster information corresponding to "B-2", of which index is 6 in the linkage table 505T, and "A-5", of which index is 5 in the linkage table 505T, is set to one in the linkage table 505T (N21). At this time, the linkage unit 505 compares numbers CR_N (N22) corresponding to "B-2" and "A-5" with current read completion numbers D_N (N23) received from the queue management table 503T. As a result, it is determined that read data RDA3 is not ready for transmission, and read data RDB2 is ready for transmission.

By the same procedure as the above, transmission processing is performed on all entries managed in the queue management table 503T, until the transmission completion counts H_N become identical to respective cluster counts.

In the embodiment described above, the queue manager 503 manages the read request issuance count R_N, the read completion count D_N and the transmission completion count H_N. The linkage unit 505 detects the current read completion count D_N, and waits for read data RD having a number CR_N identical to the read completion count D_N, even when read data items RD are read to the data buffer 504B in an order different from the order of issuing read requests NR. This enables the linkage unit 505 to notify the queue manager 503 that read data RD has been read from nonvolatile memories 10A to 10M in the order of the number CR_N. Therefore, the queue manager 503 can issue buffer read requests BR corresponding to respective read data items RD in order of issuing of read requests NR.

By virtue of the above-described structure, no circuit for rearranging read data RD in the data buffer 504B is required, which can realize a smaller circuit scale.

In addition, in the embodiment, the read request issuance count R_N, the read completion count D_N and the transmission completion count H_N are not required to be explicitly managed as independent variables.

Also, in the embodiment, the read request issuance count R_N, the read completion count D_N and the transmission completion count H_N are managed using the queue management table 503T of the queue manager 503. However, they may be managed using the command management table 502T of the command manager 502. The linkage unit 505 may be incorporated in at least one of the command manager 502, the queue manager 503 or the buffer manager 504.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   nonvolatile memories;
   a first manager configured to generate, by a read command received from an external device, a plurality of read requests corresponding to a plurality of read-unit data items read by the read command, and to manage first information indicating a state of transmission of the read-unit data items to the external device;
   a storage unit configured to temporarily store the read-unit data items read from the nonvolatile memories in a random order, based on the read requests;
   a second manager configured to manage second information indicating whether each of the read-unit data items has been read from the nonvolatile memories; and
   a third manager configured to transmit, based on the first information and the second information, the read-unit data items to the external device in an order designated by the read command, the read-unit data items being stored in the storage unit in a random order.

2. The memory system of claim 1, wherein the first information associates, with each other, command identification information indicating the read command, a count of the read-unit data items, an issuance count of the read requests corresponding to the read command, a read completion count of the read-unit data items, and a transmission completion count of the read-unit data items.

3. The memory system of claim 2, wherein the second information associates, with each other for each of the read-unit data items, data identification information of said each read-unit data item, the command identification information, a read sequence number indicating the turn of issuance of a read request included in the read requests corresponding to said each read-unit data item, and read completion information indicating whether read from the nonvolatile memories has been completed.

4. The memory system of claim 3, further comprising a controller configured to issue, to the second manager, data information including the data identification information of said each read-unit data item, the command identification information, and the read sequence number, and to issue a corresponding one of the read requests to the third manager, when the first manager issues the corresponding read request.

5. The memory system of claim 3, wherein
   when reading said each read-unit data item from the nonvolatile memories, and storing said each read-unit data item in the storage unit, the third manager issues a read completion notification to the second manager; and
   the second manager updates the read completion information in the second information, based on the read completion notification.

6. The memory system of claim 3, wherein
   the first information includes a first entry which includes the command identification information, the count of the read-unit data items, the issuance count of the read requests, the read completion count, and the transmission completion count;
   the second information includes a second entry which includes the data identification information, the command identification information, the read sequence number, and the read completion information; and when the command identification information of the first entry is identical to the command identification information of the second entry, and the read completion information of the second entry indicates a read completion, the second manager compares the read completion count of the first entry with the read sequence number of the second entry, and when the read completion count of the first entry is identical to the read sequence number of the second entry, the second manager permits transmission of read-unit data corresponding to the second entry.

7. The memory system of claim 6, wherein
when the read completion count of the first entry differs from the transmission completion count, the first manager issues, to the third manager, a request to transmit, to the external device, read-unit data corresponding to the first entry; and
the third manager transmits, to the external device, read-unit data corresponding to the first entry, in response to the request.

* * * * *